United States Patent
Yamazaki et al.

(10) Patent No.: US 9,006,735 B2
(45) Date of Patent: Apr. 14, 2015

(54) METHOD FOR PROCESSING OXIDE SEMICONDUCTOR FILM AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Shinji Ohno, Atsugi (JP); Yuichi Sato, Isehara (JP); Junichi Koezuka, Tochigi (JP); Sachiaki Tezuka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/227,231

(22) Filed: Mar. 27, 2014

(65) Prior Publication Data

US 2014/0209899 A1 Jul. 31, 2014

Related U.S. Application Data

(63) Continuation of application No. 13/547,451, filed on Jul. 12, 2012, now Pat. No. 8,716,073.

(30) Foreign Application Priority Data

Jul. 22, 2011 (JP) ................................. 2011-161252

(51) Int. Cl.
*H01L 21/336* (2006.01)
*H01L 29/786* (2006.01)
(Continued)

(52) U.S. Cl.
CPC ......... *H01L 29/7869* (2013.01); *H01L 27/1225* (2013.01); *H01L 21/02554* (2013.01); *H01L 21/02565* (2013.01); *H01L 21/02664* (2013.01)

(58) Field of Classification Search
CPC .................. H01L 27/1225; H01L 29/7869

USPC .................... 257/43, E29.295; 438/104, 150
See application file for complete search history.

(56) References Cited

U.S. PATENT DOCUMENTS

| 5,528,032 A | 6/1996 | Uchiyama |
| 5,731,856 A | 3/1998 | Kim et al. |

(Continued)

FOREIGN PATENT DOCUMENTS

| EP | 1 737 044 A | 12/2006 |
| EP | 2 226 847 A | 9/2010 |

(Continued)

OTHER PUBLICATIONS

Morosawa et al., "35.3: Distinguished Paper: A Novel Self-Aligned Top-Gate Oxide TFT for AM-OLED Displays," SID Digest '11: SID International Symposium Digest of Technical Papers, May 17, 2011, pp. 479-482.

(Continued)

*Primary Examiner* — John C Ingham
(74) *Attorney, Agent, or Firm* — Eric J. Robinson; Robinson Intellectual Property Law Office, P.C.

(57) ABSTRACT

To provide an oxide semiconductor film including a low-resistance region, which can be applied to a transistor. To provide a transistor including the oxide semiconductor film, which can perform at high speed. To provide a high-performance semiconductor device including the transistor including the oxide semiconductor film, which can perform at high speed, with high yield. A film having a reducing property is formed over the oxide semiconductor film. Next, part of oxygen atoms are transferred from the oxide semiconductor film to the film having a reducing property. Next, an impurity is added to the oxide semiconductor film through the film having a reducing property and then, the film having a reducing property is removed, so that a low-resistance region is formed in the oxide semiconductor film.

15 Claims, 30 Drawing Sheets

(51) Int. Cl.
H01L 27/12 (2006.01)
H01L 21/02 (2006.01)

(56) References Cited

U.S. PATENT DOCUMENTS

| | | | |
|---|---|---|---|
| 5,744,864 A | 4/1998 | Cillessen et al. |
| 6,281,057 B2 | 8/2001 | Aya et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,585,698 B2 | 9/2009 | Ishii |
| 7,674,650 B2 | 3/2010 | Akimoto et al. |
| 7,732,819 B2 | 6/2010 | Akimoto et al. |
| 8,193,045 B2 | 6/2012 | Omura et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0241327 A1 | 10/2007 | Kim et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0224873 A1 | 9/2010 | Sakata et al. |
| 2010/0244022 A1 | 9/2010 | Takahashi et al. |
| 2011/0062436 A1 | 3/2011 | Yamazaki et al. |
| 2011/0084266 A1 | 4/2011 | Yamazaki et al. |
| 2011/0212570 A1 | 9/2011 | Yamazaki et al. |
| 2012/0161121 A1 | 6/2012 | Yamazaki |
| 2012/0161124 A1 | 6/2012 | Yamazaki |
| 2012/0161125 A1 | 6/2012 | Yamazaki |
| 2012/0161126 A1 | 6/2012 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO 2004/114391 | 12/2004 |

OTHER PUBLICATIONS

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

(56) References Cited

OTHER PUBLICATIONS

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of The 15th International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol—Gel—Derived Zinc Oxide Films by Irradiation with Ultraviolet Lamp," Journal of Sol—Gel Science and Technology, 2003, vol. 26, pp. 181-184.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the $9^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide—Based Thin-Film Transistors by DC Sputtering," SID Digest '09: SID International Symposium of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the $16^{th}$ International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 in. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

(56) References Cited

OTHER PUBLICATIONS

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," Nirim Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, Or Al; B: Mg, Mn, Fe, Ni, Cu, or Zn] at Temperatures Over 1000° C," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6$^{th}$ International Display Workshops, Dec. 3, 2008, pp. 581-584.

Kim et al., "High-Performance oxide thin film transistors passivated by various gas plasmas," 214$^{th}$ ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

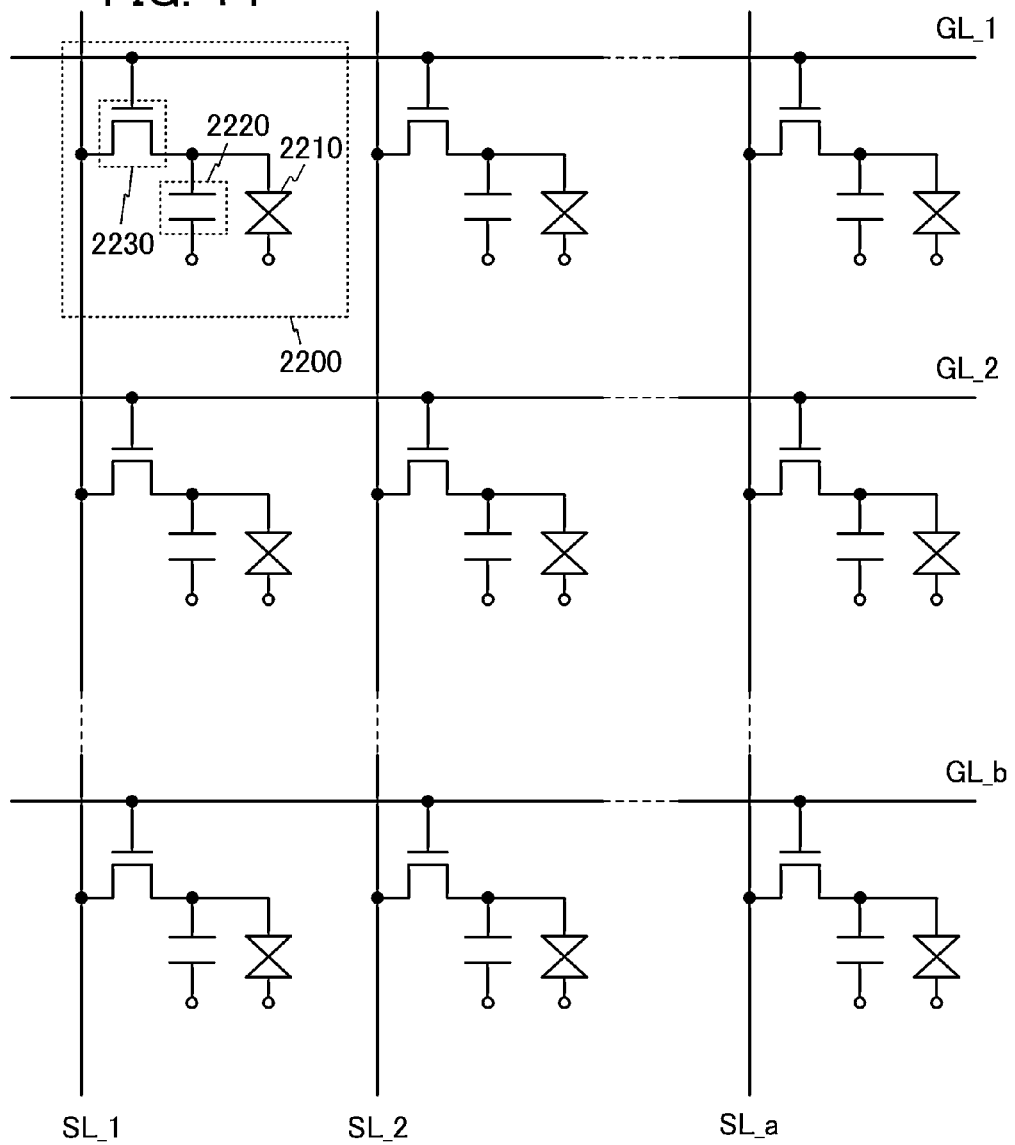

● In
○ Sn
○ Zn
● O

- In
- Ga
- Zn
- O

METHOD FOR PROCESSING OXIDE SEMICONDUCTOR FILM AND METHOD FOR MANUFACTURING SEMICONDUCTOR DEVICE

BACKGROUND OF THE INVENTION

1. Field of the Invention

The present invention relates to a method for manufacturing a semiconductor device.

In this specification, a semiconductor device refers to all devices that can operate by utilizing semiconductor characteristics. Thus, electro-optical devices, semiconductor circuits, and electronic devices are all included in the category of the semiconductor device.

2. Description of the Related Art

A technique for forming a transistor by using a semiconductor film formed over a substrate having an insulating surface has attracted attention. The transistor is applied to a wide range of electronic devices such as an integrated circuit (IC) and an image display device (display device). A silicon-based semiconductor film is widely known as a semiconductor film applicable to the transistor. As another film, an oxide semiconductor film has attracted attention.

As for a transistor including an oxide semiconductor film, better electric characteristics have been required for application to semiconductor devices with higher performance. A technique by which a transistor including an oxide semiconductor film, which can operate at high speed, is obtained owing to reduction in parasitic capacitance by self-aligned formation of low-resistance source and drain regions by an aluminum reaction method has been reported (see Non-Patent Document 1).

REFERENCE

Non-Patent Document 1

Narihiro Morosawa, Yoshihiro Ohshima, Mitsuo Morooka, Toshiaki Arai, and Tatsuya Sasaoka, "A Novel Self-Aligned Top-Gate Oxide TFT for AM-OLED Displays", SID 11 DIGEST, pp. 479-482.

SUMMARY OF THE INVENTION

An object of one embodiment of the present invention is to provide an oxide semiconductor film including a low-resistance region, which can be applied to a transistor.

An object of one embodiment of the present invention is to provide a transistor including an oxide semiconductor film, which can operate at high speed by reduction in parasitic capacitance, with high yield.

An object of one embodiment of the present invention is to provide a high-performance semiconductor device including a transistor including an oxide semiconductor film, which can operate at high speed by reduction in parasitic capacitance, with high yield.

A film having a reducing property is formed over an oxide semiconductor film, part of oxygen atoms are transferred from the oxide semiconductor film to the film having a reducing property, and then the film having a reducing property is removed, so that a low-resistance region is formed in the oxide semiconductor film.

Alternatively, a film having a reducing property is formed over an oxide semiconductor film, an impurity is added to the oxide semiconductor film through the film having a reducing property, part of oxygen atoms are transferred from the oxide semiconductor film to the film having a reducing property, and then the film having a reducing property is removed, so that a low-resistance region is formed in the oxide semiconductor film.

Further alternatively, a film having a reducing property is formed over an oxide semiconductor film, part of oxygen atoms are transferred from the oxide semiconductor film to the film having a reducing property, an impurity is added to the oxide semiconductor film through the film having a reducing property, and then the film having a reducing property is removed, so that a low-resistance region is formed in the oxide semiconductor film.

"Part of oxygen atoms are transferred from an oxide semiconductor film to a film having a reducing property" means that some of oxygen atoms included in the oxide semiconductor film are taken into the film having a reducing property.

When part of oxygen atoms are transferred from an oxide semiconductor film to a film having a reducing property, part of a material included in the film having a reducing property is transferred to the oxide semiconductor film in some cases. The part of the material included in the film having a reducing property is transferred to the oxide semiconductor film, which results in generation of a carrier in the oxide semiconductor film by the material of the film having a reducing property, and the resistance of the oxide semiconductor film can be further reduced. Specifically, the material of the film having a reducing property serves as a donor or an acceptor in the oxide semiconductor film.

As the film having a reducing property, a metal film having a reducing property or a semimetal film having a reducing property may be used.

For example, for the film having a reducing property, magnesium, aluminum, silicon, titanium, vanadium, chromium, nickel, yttrium, zirconium, niobium, molybdenum, cerium, neodymium, hafnium, tantalum, or tungsten may be used.

Alternatively, for the film having a reducing property, a material whose oxidation-reduction potential is lower than or equal to that of tungsten may be used. When the oxidation-reduction potential of the material is lower than or equal to that of tungsten, the film has a function of reducing an oxide semiconductor film; on the other hand, when the oxidation-reduction potential of the material is higher than that of tungsten, the film has a low function of reducing an oxide semiconductor film.

Alternatively, for the film having a reducing property, a material whose ionization tendency is higher than or equal to that of tungsten may be used. When the ionization tendency is higher than or equal to that of tungsten, the film has a function of reducing an oxide semiconductor film; on the other hand, when the ionization tendency is lower than that of tungsten, the film has a low function of reducing an oxide semiconductor film.

Alternatively, for the film having a reducing property, a material which reacts with oxygen to be in a passive state may be used.

For the film having a reducing property, a nickel film, an aluminum film, or a magnesium film is preferably used.

For example, when the film having a reducing property has a high reducing property with respect to the oxide semiconductor film, part of oxygen atoms can be easily transferred from the oxide semiconductor film to the film having a reducing property at room temperature.

Alternatively, by heat treatment, part of oxygen atoms can be transferred from the oxide semiconductor film to the film having a reducing property.

Note that the heat treatment is preferably performed in an inert atmosphere (e.g., a nitrogen atmosphere or an atmosphere containing a rare gas (such as helium, neon, argon, krypton, or xenon)) or a reduced-pressure atmosphere. When the heat treatment is performed in an inert atmosphere, change in quality of the film having a reducing property due to an atmosphere can be suppressed. In some cases, it is difficult to remove the film having a reducing property in a later step because of change in quality of the film having a reducing property. When the film having a reducing property remains without being removed, the electric characteristics of the transistor deteriorate in some cases.

In the case where the film having a reducing property is made to have an isulating property without being removed, it is difficult for the film having a reducing property to completely react to be insulated. Thus, the film having a reducing property which does not react or not react completely degrades the electric characteristics of the transistor in some cases. Therefore, it is preferable that the film having a reducing property be not completely insulated but removed in advance.

When oxygen atoms are transferred from the oxide semiconductor film to the film having a reducing property as described above, a region having oxygen vacancies can be formed in the oxide semiconductor film and/or in the vicinity of an interface between the oxide semiconductor film and the film having a reducing property. The region having oxygen vacancies is a low-resistance region with high carrier density.

As an impurity added to the oxide semiconductor film, an impurity which reduces the resistance of the oxide semiconductor film is used. Specifically, a material which generates a carrier in the oxide semiconductor film can be used as the impurity.

For example, as the impurity which reduces the resistance of the oxide semiconductor film, one or more of hydrogen, helium, boron, nitrogen, fluoride, neon, aluminum, phosphorus, argon, arsenic, krypton, indium, tin, antimony, and xenon may be used.

As the impurity which reduces the resistance of the oxide semiconductor film, boron or phosphorus is preferably used. Boron or phosphorus can reduce the resistance of an oxide semiconductor film even when the concentration thereof is relatively low.

Oxygen atoms are transferred from the oxide semiconductor film to the film having a reducing property and the impurity which reduces the resistance of the oxide semiconductor film is added to the oxide semiconductor film, so that a region having a resistance lower than that of a region to which an impurity is not added can be formed in the oxide semiconductor film.

When the impurity which reduces the resistance of the oxide semiconductor film is added to the oxide semiconductor film through the film having a reducing property, part of a material included in the film having a reducing property is transferred to the oxide semiconductor film in some cases. In that case, the resistance of the oxide semiconductor film can be further reduced.

In a transistor including the oxide semiconductor film including the low-resistance region, for example, the low-resistance region can serve as a source region or a drain region and a region where resistance of the semiconductor film is not reduced can serve as a channel region. Alternatively, the low-resistance region can be a lightly doped drain (LDD) region.

Alternatively, the low-resistance region can be formed using a transparent conductive film. The oxide semiconductor film including the low-resistance region may be used as an electrode or a wiring.

A method for manufacturing a transistor in which the above-described oxide semiconductor film including the low-resistance region is used as an oxide semiconductor film according to one embodiment of the present invention will be described below.

First, an oxide semiconductor film is formed over a substrate having an insulating surface. Next, an insulating film is formed over the oxide semiconductor film. Next, a conductive film is formed over the insulating film. Next, the conductive film and the insulating film are processed, so that a gate electrode and a gate insulating film with a top surface shape similar to that of the gate electrode are formed and part of the oxide semiconductor film is exposed. Next, a film having a reducing property is formed over the exposed oxide semiconductor film and the gate electrode. Next, the film having a reducing property is removed. Thus, a transistor is manufactured.

Alternatively, a transistor is manufactured in the following manner. An oxide semiconductor film is formed over a substrate having an insulating surface. Next, an insulating film is formed over the oxide semiconductor film. Next, a conductive film is formed over the insulating film. Next, the conductive film and the insulating film are processed, so that a gate electrode and a gate insulating film with a top surface shape similar to that of the gate electrode are formed and part of the oxide semiconductor film is exposed. Next, a film having a reducing property is formed over the exposed oxide semiconductor film and the gate electrode. Next, heat treatment is performed. Next, the film having a reducing property is removed.

Alternatively, a transistor is manufactured in the following manner. An oxide semiconductor film is formed over a substrate having an insulating surface. Next, an insulating film is formed over the oxide semiconductor film. Next, a conductive film is formed over the insulating film. Next, the conductive film and the insulating film are processed, so that a gate electrode and a gate insulating film with a top surface shape similar to that of the gate electrode are formed and part of the oxide semiconductor film is exposed. Next, a film having a reducing property is formed over the exposed oxide semiconductor film and the gate electrode. Next, the film having a reducing property is removed. Next, heat treatment is performed.

Alternatively, a transistor is manufactured in the following manner. An oxide semiconductor film is formed over a substrate having an insulating surface. Next, an insulating film is formed over the oxide semiconductor film. Next, a conductive film is formed over the insulating film. Next, the conductive film and the insulating film are processed, so that a gate electrode and a gate insulating film with a top surface shape similar to that of the gate electrode are formed and part of the oxide semiconductor film is exposed. Next, a film having a reducing property is formed over the exposed oxide semiconductor film and the gate electrode. Next, an impurity which reduces the resistance of the oxide semiconductor film is added to part of the oxide semiconductor film through the film having a reducing property using the gate electrode as a mask. Next, the film having a reducing property is removed.

Alternatively, a transistor is manufactured in the following manner. An oxide semiconductor film is formed over a substrate having an insulating surface. Next, an insulating film is formed over the oxide semiconductor film. Next, a conductive film is formed over the insulating film. Next, the conductive film and the insulating film are processed, so that a gate electrode and a gate insulating film with a top surface shape similar to that of the gate electrode are formed and part of the oxide semiconductor film is exposed. Next, a film having a reducing property is formed over the exposed oxide semiconductor film and the gate electrode. Next, an impurity which reduces the resistance of the oxide semiconductor film is added to part of the oxide semiconductor film through the film having a reducing property using the gate electrode as a mask. Next, heat treatment is performed. Next, the film having a reducing property is removed.

Alternatively, a transistor is manufactured in the following manner. An oxide semiconductor film is formed over a substrate having an insulating surface. Next, an insulating film is formed over the oxide semiconductor film. Next, a conductive film is formed over the insulating film. Next, the conductive film and the insulating film are processed, so that a gate electrode and a gate insulating film with a top surface shape similar to that of the gate electrode are formed and part of the oxide semiconductor film is exposed. Next, a film having a reducing property is formed over the exposed oxide semiconductor film and the gate electrode. Next, an impurity which reduces the resistance of the oxide semiconductor film is added to part of the oxide semiconductor film through the film having a reducing property using the gate electrode as a mask. Next, the film having a reducing property is removed. Next, heat treatment is performed.

Alternatively, a transistor is manufactured in the following manner. An oxide semiconductor film is formed over a substrate having an insulating surface. Next, an insulating film is formed over the oxide semiconductor film. Next, a conductive film is formed over the insulating film. Next, the conductive film and the insulating film are processed, so that a gate electrode and a gate insulating film with a top surface shape similar to that of the gate electrode are formed and part of the oxide semiconductor film is exposed. Next, a film having a reducing property is formed over the exposed oxide semiconductor film and the gate electrode. Next, heat treatment is performed. Next, an impurity which reduces the resistance of the oxide semiconductor film is added to part of the oxide semiconductor film through the film having a reducing property using the gate electrode as a mask. Next, the film having a reducing property is removed.

Since an impurity is added after the film having a reducing property is formed, the film having a reducing property is formed on a sidewall of the gate electrode and regions of the oxide semiconductor film to which the impurity is not added are wider than those in the case where the film having a reducing property is not provided. The region becomes an LDD region, and the sheet resistance thereof is greater than or equal to 1 k$\Omega$/sq. and less than or equal to 100 M$\Omega$/sq., preferably greater than or equal to 10 k$\Omega$/sq. and less than or equal to 50 M$\Omega$/sq., more preferably greater than or equal to 100 k$\Omega$/sq. and less than or equal to 20 M$\Omega$/sq. Note that in this specification, even a region to which an impurity is not added is referred to as an LDD region as long as part of oxygen atoms are released from the region.

With the LDD regions, degradation of the transistor, such as hot carrier degradation, is reduced, and shift of the threshold voltage in the negative direction due to a short channel length can be suppressed.

Alternatively, a transistor is manufactured in the following manner. An oxide semiconductor film is formed over a substrate having an insulating surface. Next, an insulating film is formed over the oxide semiconductor film. Next, a conductive film is formed over the insulating film. Next, the conductive film and the insulating film are processed, so that a gate electrode and a gate insulating film with a top surface shape similar to that of the gate electrode are formed and part of the oxide semiconductor film is exposed. Next, an impurity which reduces the resistance of the oxide semiconductor film is added to part of the oxide semiconductor film using the gate electrode as a mask. Next, a film having a reducing property is formed over the exposed oxide semiconductor film and the gate electrode. Next, the film having a reducing property is removed. Note that the impurity may be added to the part of the oxide semiconductor film through the insulating film. In that case, the gate insulating film is formed after the impurity addition.

Alternatively, a transistor is manufactured in the following manner. An oxide semiconductor film is formed over a substrate having an insulating surface. Next, an insulating film is formed over the oxide semiconductor film. Next, a conductive film is formed over the insulating film. Next, the conductive film and the insulating film are processed, so that a gate electrode and a gate insulating film with a top surface shape similar to that of the gate electrode are formed and part of the oxide semiconductor film is exposed. Next, an impurity which reduces the resistance of the oxide semiconductor film is added to part of the oxide semiconductor film using the gate electrode as a mask. Next, a film having a reducing property is formed over the exposed oxide semiconductor film and the gate electrode. Next, heat treatment is performed. Next, the film having a reducing property is removed. Note that the impurity may be added to the part of the oxide semiconductor film through the insulating film. In that case, the gate insulating film is formed after the impurity addition.

Alternatively, a transistor is manufactured in the following manner. An oxide semiconductor film is formed over a substrate having an insulating surface. Next, an insulating film is formed over the oxide semiconductor film. Next, a conductive film is formed over the insulating film. Next, the conductive film and the insulating film are processed, so that a gate electrode and a gate insulating film with a top surface shape similar to that of the gate electrode are formed and part of the oxide semiconductor film is exposed. Next, an impurity which reduces the resistance of the oxide semiconductor film is added to part of the oxide semiconductor film using the gate electrode as a mask. Next, a film having a reducing property is formed over the exposed oxide semiconductor film and the gate electrode. Next, the film having a reducing property is removed. Next, heat treatment is performed. Note that the impurity may be added to the part of the oxide semiconductor film through the insulating film. In that case, the gate insulating film is formed after the impurity addition.

The resistance of the region of the oxide semiconductor film to which the impurity is added and/or the resistance of the region where the film having a reducing property is formed is reduced, and the sheet resistance thereof is greater than or equal to 10 $\Omega$/sq. and less than or equal to 100 k$\Omega$/sq., preferably greater than or equal to 10 $\Omega$/sq. and less than or equal to 20 k$\Omega$/sq., more preferably greater than or equal to 10 $\Omega$/sq. and less than or equal to 3 k$\Omega$/sq.

Since the above-described region of the oxide semiconductor film whose resistance is reduced is formed in a self-aligned manner using the gate electrode as a mask, there is substantially no overlap between the low-resistance region and the gate electrode and parasitic capacitance can be reduced. Therefore, a transistor according to one embodiment of the present invention can operate at high speed without decrease in operation speed of the transistor due to parasitic capacitance even when the transistor is miniaturized.

Further, since the film having a reducing property, which is used for reduction of resistance of the oxide semiconductor film, is removed in a later step, defects such as a short-circuit caused by the film having a reducing property which remains after the transistor is manufactured can be reduced. The reduction of defects can improve yield and increase productivity of the transistor.

Note that a sidewall insulating film may be formed in contact with a sidewall of the gate electrode.

The sidewall insulating film may be formed in a self-aligned manner by performing highly anisotropic etching on the insulating film after the insulating film is formed over the gate electrode. As highly anisotropic etching, for example, dry etching is preferably performed.

In the case where the sidewall insulating film is provided in contact with the sidewall of the gate electrode, the gate insulating film may be formed to have a top surface shape similar to that of a region including the gate electrode and the sidewall insulating film.

The gate electrode and the sidewall insulating film may be used as masks in impurity addition. In that case, the impurity is not added to a region of the oxide semiconductor film overlapping with the sidewall insulating film.

Alternatively, the gate electrode may be used as a mask in impurity addition, and then the sidewall insulating film may be formed.

Further, the sidewall insulating film may be provided before the film having a reducing property is formed.

Since the sidewall insulating film is provided before the film having a reducing property is formed, a short-circuit between the gate electrode and the source and drain regions hardly occurs and factors of degrading the electric characteristics of the transistor can be reduced even in the case where the film having a reducing property is not completely removed.

When a region (second region) of the oxide semiconductor film which overlaps with the sidewall insulating film has a higher resistance than a region (first region) of the oxide semiconductor film which does not overlap with the sidewall insulating film or the gate electrode, degradation of the transistor, such as hot carrier degradation, is reduced, and shift of the threshold voltage in the negative direction due to a short channel length can be suppressed.

The first region has a sheet resistance of greater than or equal to 10 Ω/sq. and less than or equal to 100 kΩ/sq., preferably greater than or equal to 10 Ω/sq. and less than or equal to 20 kΩ/sq., more preferably greater than or equal to 10 Ω/sq. and less than or equal to 3 kΩ/sq.

Further, in the case where the second region is an LDD region, the sheet resistance is greater than or equal to 1 kΩ/sq. and less than or equal to 100 MΩ/sq., preferably greater than or equal to 10 kΩ/sq. and less than or equal to 50 MΩ/sq., more preferably greater than or equal to 100 kΩ/sq. and less than or equal to 20 MΩ/sq.

Note that in the case where the second region is an offset region (also referred to as an Loff region), the sheet resistance of the second region is substantially the same as that of a channel region of the transistor in an off-state. Specifically, it is greater than or equal to 50 MΩ/sq., preferably greater than or equal to 1 GΩ/sq.

Alternatively, the Loff region has an extremely low carrier density, specifically less than or equal to $1\times10^{14}$/cm$^3$, preferably less than or equal to $1\times10^{12}$/cm$^3$, more preferably less than or equal to $1\times10^{10}$/cm$^3$.

Since the above-described region of the oxide semiconductor film whose resistance is reduced is formed in a self-aligned manner using the gate electrode and/or the sidewall insulating film as a mask, there is substantially no overlap between the low-resistance region and the gate electrode and parasitic capacitance can be reduced. Therefore, a transistor according to one embodiment of the present invention can operate at high speed without decrease in operation speed of the transistor due to parasitic capacitance even when the transistor is miniaturized.

Note that in the transistor according to one embodiment of the present invention, low-resistance regions formed by the above-described method serve as a source region and a drain region, and each of the source region and the drain region may be connected to a wiring.

An interlayer insulating film may be provided over the transistor according to one embodiment of the present invention. In addition, the above-described wiring may be provided over the interlayer insulating film.

The transistor according to one embodiment of the present invention may be provided with a source electrode and a drain electrode respectively connected to the source region and the drain region.

As described above, according to one embodiment of the present invention, low-resistance regions can be formed in the oxide semiconductor film.

Further, the film having a reducing property does not remain in the transistor, whereby defects such as a short-circuit of the transistor caused by the film having a reducing property are reduced; thus, yield of the transistor can be improved and productivity can be increased.

With LDD regions or Loff regions, the shift of a threshold voltage in the negative direction due to a short channel length of the transistor can be suppressed.

A high-performance semiconductor device including the transistor can be manufactured with high productivity.

It is possible to form an oxide semiconductor film including low-resistance regions, which can be applied to a transistor.

It is possible to manufacture a transistor capable of operating at high speed, which includes the oxide semiconductor film, with high productivity.

It is possible to manufacture a high-performance semiconductor device including the transistor capable of operating at high speed, which includes the oxide semiconductor film, with high productivity.

BRIEF DESCRIPTION OF THE DRAWINGS

In the accompanying drawings:

FIG. 14 is a circuit diagram illustrating an example of a liquid crystal display device including a transistor according to one embodiment of the present invention;

DETAILED DESCRIPTION OF THE INVENTION

Figure 1A:
FIGS. 1A to 1D are cross-sectional views illustrating an example of a method for forming an oxide semiconductor film.

Hereinafter, embodiments of the present invention will be described in detail with reference to the accompanying drawings. However, the present invention is not limited to the description below, and it is easily understood by those skilled in the art that modes and details thereof can be modified in various ways. Therefore, the present invention is not construed as being limited to the description of the embodiments and the examples below. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain. A portion simply called "source" refers to any of a source electrode and a source region. Further, a portion simply called "drain" refers to any of a drain electrode and a drain region.

Note that voltage refers to a potential difference between a certain potential and a reference potential (e.g., a source potential, a ground potential) in many cases. Accordingly, voltage can also be referred to as potential and vice versa.

Even when it is written in this specification that "to be connected", there is a case in which no physical connection is made in an actual circuit and a wiring is only extended. An element which does not adversely affect circuit operation, such as a resistor, may be included between the connected components.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, a method for forming an oxide semiconductor film according to one embodiment of the present invention will be described with reference to FIGS. 1A to 1D, FIGS. 2A to 2E, and FIGS. 3A to 3E.

Note that FIGS. 1A to 1D, FIGS. 2A to 2E, and FIGS. 3A to 3E are enlarged cross-sectional schematic views of the vicinity of an interface between the oxide semiconductor film and a film having a reducing property.

First, an oxide semiconductor film 100 is formed (see FIG. 1A).

Figure 1B:
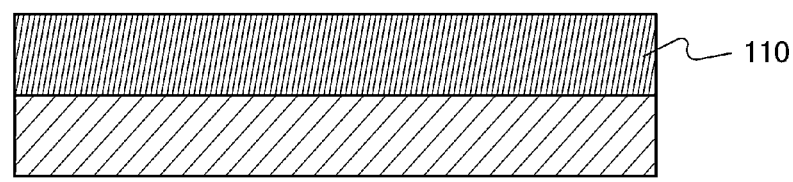

Next, a film 110 having a reducing property is provided over and in contact with the oxide semiconductor film 100 (see FIG. 1B).

Figure 1C:
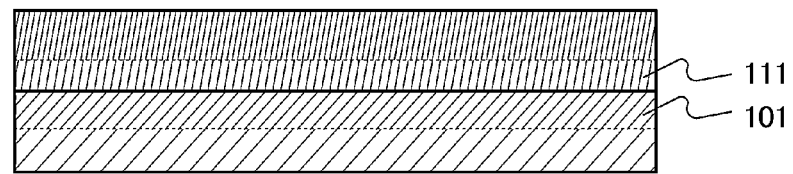

Next, part of oxygen atoms are transferred from the oxide semiconductor film 100 to the film 110 having a reducing property, and a region 101 of the oxide semiconductor film 100 from which the part of oxygen atoms are released and a region 111 containing oxygen atoms are formed in the vicinity of an interface between the oxide semiconductor film 100 and the film 110 having a reducing property (see FIG. 1C).

Note that the region 101 from which the part of oxygen atoms are released is formed in such a manner that the part of oxygen atoms are released from the oxide semiconductor film 100.

The region 111 containing oxygen atoms is formed in such a manner that oxygen atoms are added to the film 110 having a reducing property.

Figure 1D:
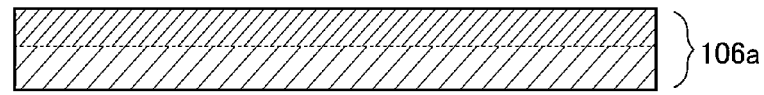

Next, the film 110 having a reducing property and the region 111 containing oxygen atoms are removed, whereby an oxide semiconductor film 106a including the region 101 from which the part of oxygen atoms are released can be formed (see FIG. 1D).

The region 101 of the oxide semiconductor film 100 from which the part of oxygen atoms are released is a region having a resistance lower than that of the oxide semiconductor film 100. This is because part of oxygen vacancies in the oxide semiconductor film become donors to generate electrons; thus, the carrier density is increased.

Therefore, the oxide semiconductor film 106a has a low resistance.

Note that heat treatment is preferably performed in order to transfer part of oxygen atoms from the oxide semiconductor film 100 to the film 110 having a reducing property.

Note that in the case where the film 110 having a reducing property has a sufficient reducing property even at room temperature, the heat treatment becomes unnecessary.

When the part of oxygen atoms are transferred from the oxide semiconductor film 100 to the film 110 having a reducing property, part of a material of the film 110 having a reducing property is transferred to the oxide semiconductor film 100 in some cases. The part of the material of the film 110 having a reducing property is transferred to the oxide semiconductor film 100, so that a carrier is generated in the oxide semiconductor film 100 by the material of the film 110 having a reducing property and the resistance of the oxide semiconductor film 100 can be further reduced. Specifically, the material of the film 110 having a reducing property serves as a donor or an acceptor in the oxide semiconductor film 100.

For the oxide semiconductor film 100, any of the following materials can be used for example: an In—O-based material, a Ga—O-based material, a Zn—O-based material, a Sn—O-based material, two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material, three-component metal oxides such as an In—Ga—Zn—O-based material, an In—Al—Zn—O-based material, an In—Sn—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, an In—Lu—Zn—O-based material, and an In—Ni—Zn—O-based material, and four-component metal oxides such as an In—Sn—Ga—Zn—O-based material, an In—Hf—Ga—Zn—O-based material, an In—Al—Ga—Zn—O-based material, an In—Sn—Al—Zn—O-based material, an In—Sn—Hf—Zn—O-based material, and an In—Hf—Al—Zn—O-based material.

For example, an "In—Ga—Zn—O-based material" means an oxide containing In, Ga, and Zn as its main components and there is no particular limitation on the atomic ratio of In:Ga:Zn.

In the case where an In—Zn—O-based material is used for the oxide semiconductor film 100, the atomic ratio of In to Zn is greater than or equal to 0.5 and less than or equal to 50, preferably greater than or equal to 1 and less than or equal to 20, further preferably greater than or equal to 1.5 and less than or equal to 15. When the atomic ratio of Zn is in the above range, the field effect mobility of the transistor can be improved. Here, when the atomic ratio of the compound is In:Zn:O=X:Y:Z, the relation of $Z>1.5X+Y$ is preferably satisfied.

Further, a material represented by $InMO_3(ZnO)_m$, (m>0) may be used for the oxide semiconductor film 100. Here, M represents one or more metal elements selected from Zn, Ga, Al, Mn, Sn, Hf, and Co. For example, M may be Ga, Ga and Al, Ga and Mn, Ga and Co, or the like.

As the film 110 having a reducing property, a metal film or a semimetal film may be used.

For example, for the film 110 having a reducing property, magnesium, aluminum, silicon, titanium, vanadium, chromium, nickel, yttrium, zirconium, niobium, molybdenum, cerium, neodymium, hafnium, tantalum, or tungsten may be used.

Alternatively, for the film 110 having a reducing property, a material whose oxidation-reduction potential is lower than or equal to that of tungsten may be used.

Alternatively, for the film 110 having a reducing property, a material whose ionization tendency is lower than or equal to that of tungsten may be used.

Alternatively, for the film 110 having a reducing property, a material which reacts with oxygen to be in a passive state may be used.

As the film 110 having a reducing property, a nickel film, an aluminum film, or a magnesium film is preferably used.

Next, a method for forming an oxide semiconductor film, which is different from the method in FIGS. 1A to 1D, will be described with reference to FIGS. 2A to 2E.

Figure 2A:
FIGS. 2A to 2E are cross-sectional views illustrating an example of a method for forming an oxide semiconductor film.

First, the oxide semiconductor film 100 is formed (see FIG. 2A).

Figure 2B:
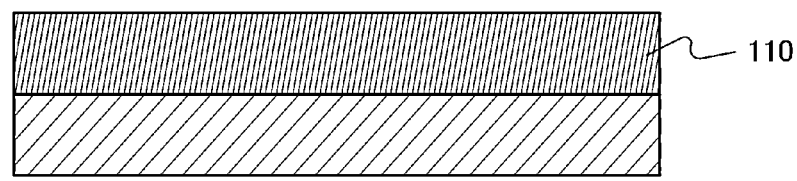

Next, the film 110 having a reducing property is provided over and in contact with the oxide semiconductor film 100 (see FIG. 2B).

Figure 2C:
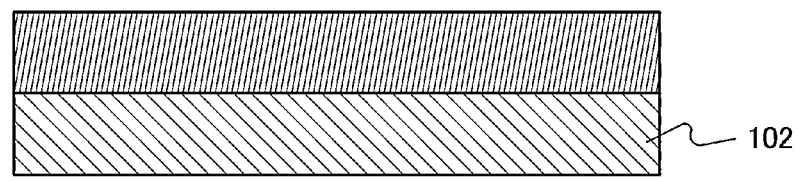

Next, an impurity which reduces the resistance of the oxide semiconductor film is added to the oxide semiconductor film 100 through the film 110 having a reducing property, whereby an oxide semiconductor film 102 containing an impurity is formed (see FIG. 2C).

Note that when the impurity which reduces the resistance of the oxide semiconductor film is added to the oxide semiconductor film 100 through the film 110 having a reducing property, part of a material included in the film 110 having a reducing property is transferred to the oxide semiconductor film 100 in some cases. In that case, the resistance of the oxide semiconductor film 100 can be further reduced.

The addition of the impurity may be performed by an ion implantation method or an ion doping method, for example.

The addition amount of the impurity is greater than or equal to $1\times10^{13}$ ions/cm$^2$ and less than or equal to $1\times10^{16}$ ions/cm$^2$, preferably greater than or equal to $5\times10^{13}$ ions/cm$^2$ and less than or equal to $5\times10^{15}$ ions/cm$^2$.

Figure 2D:
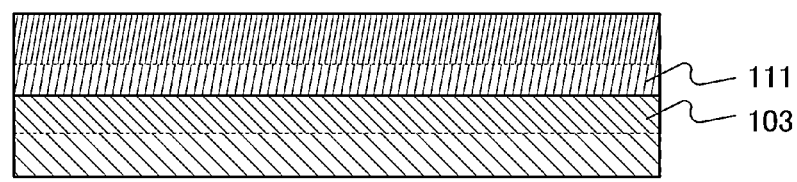

Next, part of oxygen atoms are transferred from the oxide semiconductor film 102 containing the impurity to the film 110 having a reducing property, and a region 103 of the oxide semiconductor film 102 containing the impurity from which the part of oxygen atoms are released and the region 111 containing oxygen atoms are formed in the vicinity of an interface between the oxide semiconductor film 102 containing the impurity and the film 110 having a reducing property (see FIG. 2D).

Figure 2E:

Next, the film 110 having a reducing property and the region 111 containing oxygen atoms are removed, whereby an oxide semiconductor film 106b including the oxide semiconductor film 102 containing the impurity and the region 103 from which the part of oxygen atoms are released can be formed (see FIG. 2E).

The oxide semiconductor film 102 containing the impurity is formed by adding the impurity which reduces the resistance of the oxide semiconductor film to the oxide semiconductor film 100; therefore, the oxide semiconductor film 102 containing the impurity has a resistance lower than that of the oxide semiconductor film 100.

The region 103 of the oxide semiconductor film 102 containing the impurity from which the part of oxygen atoms are released is a region having a resistance lower than that of the oxide semiconductor film 102 containing the impurity. This is because part of oxygen vacancies in the oxide semiconductor film become donors to generate electrons; thus, the carrier density is increased.

Therefore, the oxide semiconductor film 106b has a low resistance.

Note that similarly to FIGS. 1A to 1D, heat treatment is preferably performed in order to transfer part of oxygen atoms from the oxide semiconductor film 102 containing the impurity to the film 110 having a reducing property.

Next, a method for forming an oxide semiconductor film, which is different from the methods in FIGS. 1A to 1D and FIGS. 2A to 2E, will be described with reference to FIGS. 3A to 3E.

Figure 3A:
FIGS. 3A to 3E are cross-sectional views illustrating an example of a method for forming an oxide semiconductor film.

First, the oxide semiconductor film 100 is formed (see FIG. 3A).

Figure 3B:
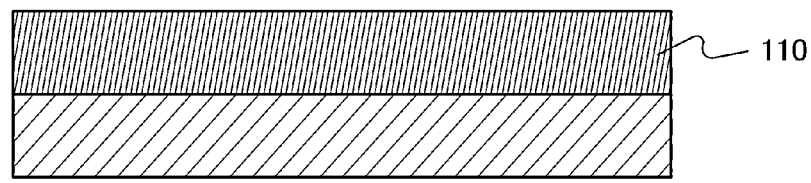

Next, the film 110 having a reducing property is provided over and in contact with the oxide semiconductor film 100 (see FIG. 3B).

Figure 3C:
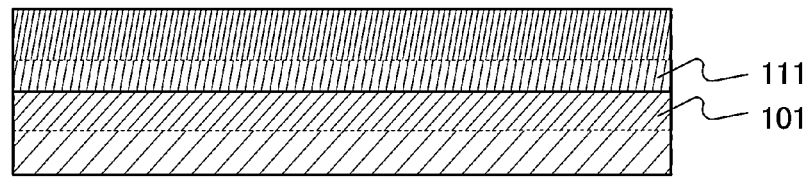

Next, part of oxygen atoms are transferred from the oxide semiconductor film 100 to the film 110 having a reducing property, and the region 101 from which the part of oxygen atoms are released and the region 111 containing oxygen atoms are formed in the vicinity of an interface between the oxide semiconductor film 100 and the film 110 having a reducing property (see FIG. 3C).

Figure 3D:
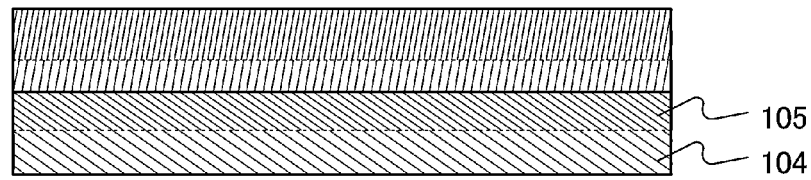

Next, an impurity which reduces the resistance of the oxide semiconductor film is added to the oxide semiconductor film 100 and the region 101 from which the part of oxygen atoms are released through the film 110 having a reducing property and the region 111 containing oxygen atoms, whereby an oxide semiconductor film 104 containing an impurity and a region 105 which contains an impurity and from which the part of oxygen atoms are released are formed (see FIG. 3D).

Figure 3E:

Next, the film 110 having a reducing property and the region 111 containing oxygen atoms are removed, whereby an oxide semiconductor film 106c including the oxide semiconductor film 104 containing the impurity and the region 105 which contains the impurity and from which the part of oxygen atoms are released can be formed (see FIG. 3E).

The oxide semiconductor film 104 containing the impurity is formed by adding the impurity which reduces the resistance of the oxide semiconductor film to the oxide semiconductor film 100; therefore, the oxide semiconductor film 104 containing the impurity has a resistance lower than that of the oxide semiconductor film 100.

The region 105 of the oxide semiconductor film 104 containing the impurity which contains the impurity and from which the part of oxygen atoms are released is a region having a resistance lower than that of the oxide semiconductor film 104 containing the impurity. This is because part of oxygen vacancies in the oxide semiconductor film become donors to generate electrons; thus, the carrier density is increased.

Therefore, the oxide semiconductor film 106c has a low resistance.

Note that similarly to FIGS. 1A to 1D, heat treatment is preferably performed in order to transfer part of oxygen atoms from the oxide semiconductor film 100 to the film 110 having a reducing property.

Through the above steps, an oxide semiconductor film including a low-resistance region can be formed.

The oxide semiconductor film including a low-resistance region can be used for a source region and a drain region of a transistor, a transparent conductive film of a semiconductor device, or the like.

The oxide semiconductor film including a low-resistance region has a sheet resistance of greater than or equal to 10 $\Omega$/sq. and less than or equal to 100 k$\Omega$/sq., preferably greater than or equal to 10 $\Omega$/sq. and less than or equal to 20 k$\Omega$/sq., more preferably greater than or equal to 10 $\Omega$/sq. and less than or equal to 3 k$\Omega$/sq.

This embodiment can be implemented in appropriate combination with any of the other embodiments.

Embodiment 2

In this embodiment, an example of a method for manufacturing a transistor which is a semiconductor device according to one embodiment of the present invention will be described with reference to FIGS. 4A to 4D, FIGS. 5A to 5C, FIGS. 6A and 6B, FIGS. 7A to 7C, FIGS. 8A to 8D, FIGS. 9A to 9D, FIGS. 10A to 10D, FIGS. 11A and 11B, FIGS. 12A to 12D, and FIGS. 13A to 13C.

Figure 4A:
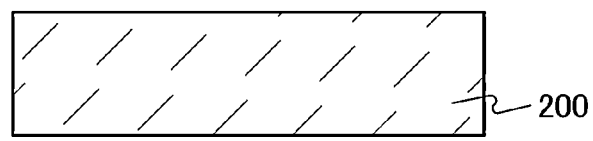
FIGS. 4A to 4D are cross-sectional views illustrating an example of a method for manufacturing a semiconductor device.

First, a substrate 200 is prepared (see FIG. 4A).

The substrate 200 has an insulating surface. Alternatively, a substrate over which a base insulating film is provided may be used as the substrate 200.

A substrate from which oxygen atoms are released by heat treatment may be used as the substrate 200.

"To release oxygen atoms by heat treatment" means that the amount of released oxygen is greater than or equal to $3.0 \times 10^{14}$ atoms/cm$^2$, greater than or equal to $1.0 \times 10^{15}$ atoms/cm$^2$, greater than or equal to $3.0 \times 10^{15}$ atoms/cm$^2$, greater than or equal to $5.0 \times 10^{15}$ atoms/cm$^2$, or greater than or equal to $1.0 \times 10^{16}$ atoms/cm$^2$ in thermal desorption spectroscopy (TDS) on an oxygen atom basis.

The amount of released oxygen is measured by TDS analysis at a substrate temperature higher than or equal to 150° C. and lower than or equal to 700° C., higher than or equal to 200° C. and lower than or equal to 650° C., or higher than or equal to 250° C. and lower than or equal to 470° C. For example, it is presumed that oxygen release at a substrate temperature lower than 150° C. is mainly caused by oxygen that is adsorbed to a substrate surface and has relatively low stability; therefore, it is preferable that a temperature lower than or equal to 150° C. be not included in the measurement range. When the substrate temperature is set to be lower than or equal to 700° C., the amount of released oxygen that fits an actual manufacturing process of the transistor can be evaluated.

Here, a method for measuring the amount of released oxygen using TDS analysis will be described.

The total amount of the gas which is released at the time of TDS analysis is proportional to an integral value of the ion intensity of the released gas. Then, the integral value is compared with that of a standard sample, whereby the total amount of the released gas can be calculated. The reference value of a standard sample refers to the ratio of the density of a predetermined atom contained in a sample to the integral value of a spectrum.

For example, the number of released oxygen molecules ($N_{O2}$) from an insulating film can be calculated according to Formula 1 using the TDS analysis results of a silicon wafer containing hydrogen at a predetermined density, which is the reference sample, and the TDS analysis results of the insulating film. Here, all gasses having a mass-to-charge ratio (m/z) of 32 which are obtained by the TDS analysis are assumed to originate from an oxygen molecule. $CH_3OH$ can be given as a gas where m/z=32, but is not taken into consideration on the assumption that it is unlikely to be present. Further, an oxygen molecule including an oxygen atom where m/z=17 or 18, which is an isotope of an oxygen atom, is also not taken into consideration because the proportion of such a molecule in the natural world is minimal.

$$N_{O2} = \frac{N_{H2}}{S_{H2}} \times S_{O2} \times \alpha \qquad \text{[Formula 1]}$$

The value $N_{H2}$ is obtained by conversion of the number of hydrogen molecules desorbed from the standard sample into densities. The value $S_{H2}$ is the integral value of ion intensity when the standard sample is subjected to TDS analysis. Here, the reference value of the standard sample is set to $N_{H2}/S_{H2}$. The value $S_{O2}$ is the integral value of ion intensity when the insulating film is subjected to TDS analysis. $\alpha$ is a coefficient affecting the ion intensity in the TDS analysis. Refer to Japanese Published Patent Application No. H6-275697 for details of Formula 1. Note that a thermal desorption spectroscopy apparatus produced by ESCO Ltd., EMD-WA1000S/W is used as a TDS device which measures the amount of released oxygen from the insulating film, and the amount of released oxygen from the insulating film is measured using a silicon wafer containing hydrogen atoms at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

By supply of oxygen from the substrate 200, the density of an interface level at an interface between a channel region of the oxide semiconductor film and the substrate 200 can be reduced. As a result, carrier trapping at the interface between the channel region of the oxide semiconductor film and the substrate 200, which occurs due to an operation of the transistor or the like, can be suppressed. Thus, a transistor with less deterioration in electric characteristics can be obtained.

Although there is no particular limitation on a material for the substrate 200, the substrate 200 has at least heat resistance high enough to withstand heat treatment to be performed later. For example, an insulating substrate such as a glass substrate, a ceramic substrate, a quartz substrate, or a sapphire substrate, a semiconductor substrate such as a silicon wafer, or a conductive substrate such as a stainless steel substrate may be used as the substrate 200. In the case where a semiconductor substrate or a conductive substrate is used, an insulating material is provided over a surface of the substrate 200. Alternatively, a plastic substrate having heat resistance high enough to withstand the heat treatment to be performed later may be used.

For the oxide semiconductor film formed later to easily have crystallinity, the surface of the substrate 200 over which the transistor is formed is preferably planar.

Specifically, the substrate 200 with an average surface roughness ($R_a$) of less than or equal to 1 nm, preferably less than or equal to 0.3 nm is used. Note that the average surface roughness ($R_a$) is obtained by expanding, into three dimensions, arithmetic mean surface roughness that is defined by JIS B 0601:2001 (ISO4287:1997) so as to be able to apply it to a curved surface. $R_a$ can be expressed as an "average value of the absolute values of deviations from a reference surface to a designated surface" and is defined by Formula 2.

$$Ra = \frac{1}{S_0} \int_{y_1}^{y_2} \int_{x_1}^{x_2} |f(x, y) - Z_0| dx dy \qquad \text{[Formula 2]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Moreover, $S_0$ represents the area of a rectangle which is obtained by projecting the specific surface on the xy plane, and $Z_0$ represents the average height of the designated surface. Further, $R_a$ can be measured using an atomic force microscope (AFM).

Figure 4B:
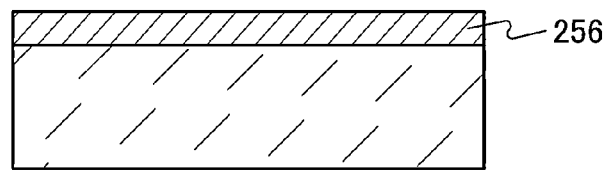

Next, an oxide semiconductor film 256 is formed over the substrate 200 (see FIG. 4B). For the oxide semiconductor film 256, the material of the oxide semiconductor film 100 described in Embodiment 1 may be used, for example.

As for the oxide semiconductor film 256, it is important to increase the film formation power, reduce the film formation pressure, reduce a distance between the target and the substrate (T-S distance), and increase a substrate heating temperature (Tsub) at the film formation.

Specifically, a film formation power per unit area is set to greater than or equal to 5 W/cm$^2$ and less than or equal to 50 W/cm$^2$; the film formation pressure is set to greater than or equal to 0.01 Pa and less than or equal to 0.4 Pa, preferably greater than or equal to 0.05 Pa and less than or equal to 0.3 Pa; the T-S distance is set to greater than or equal to 10 mm and less than or equal to 200 mm, preferably greater than or equal to 20 mm and less than or equal to 80 mm; Tsub is set to higher than or equal to 100° C. and lower than or equal to 500° C., preferably higher than or equal to 150° C. and lower than or equal to 450° C.

The concentration of impurities in the oxide semiconductor film 256 is preferably as low as possible. In order to reduce the concentration of impurities in the oxide semiconductor film 256, it is effective to increase the purity of the material and reduce the internal leak and the external leak of a deposition chamber.

The oxide semiconductor film 256 is formed by the above method, whereby a polycrystalline oxide semiconductor film or a c-axis-aligned crystalline oxide semiconductor (CAAC-OS) film is obtained.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

An example of a crystal structure of the CAAC-OS film will be described in detail with reference to FIGS. 22A to 22E, FIGS. 23A to 23C, FIGS. 24A to 24C, and FIGS. 25A and 25B. In FIGS. 22A to 22E, FIGS. 23A to 23C, FIGS. 24A to 24C, and FIGS. 25A and 25B, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 22A to 22E, O surrounded by a circle represents tetracoordinate O and O surrounded by a double circle represents tricoordinate O.

Figure 22A:
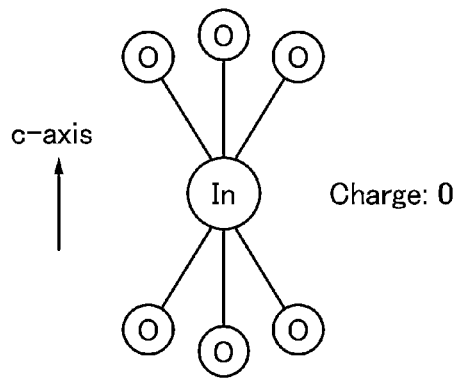
FIGS. 22A to 22E are diagrams each illustrating a crystal structure of an oxide semiconductor according to one embodiment of the present invention.

FIG. 22A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 22A is actually an octahedral structure, but is illustrated as a planar structure for simplicity. Note that three tetracoordinate O atoms exist in each of an upper half and a lower half in FIG. 22A. In the small group illustrated in FIG. 22A, electric charge is 0.

Figure 22D:
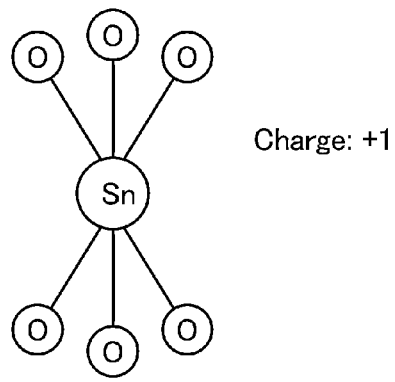
Figure 22B:
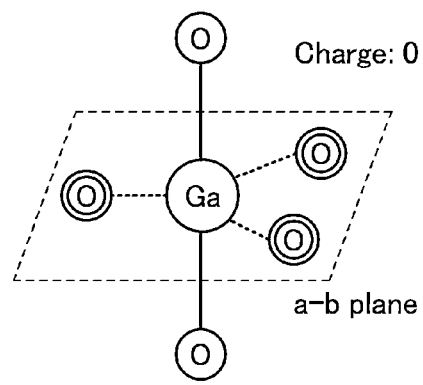

FIG. 22B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 22B. An In atom can also have the structure illustrated in FIG. 22B because an In atom can have five ligands. In the small group illustrated in FIG. 22B, electric charge is 0.

Figure 22E:
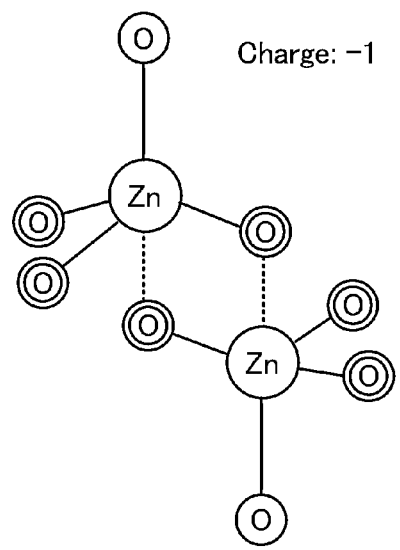
Figure 22C:
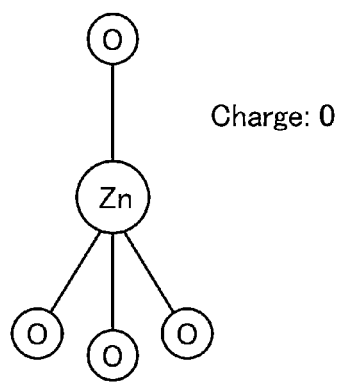

FIG. 22C illustrates a structure including one tetracoordinate Zn atom and four tetracoordinate O atoms proximate to the Zn atom. In FIG. 22C, one tetracoordinate O atom exists in an upper half and three tetracoordinate O atoms exist in a lower half.

Alternatively, three tetracoordinate O atoms may exist in the upper half and one tetracoordinate O atom may exist in the lower half in FIG. 22C. In the small group illustrated in FIG. 22C, electric charge is 0.

FIG. 22D illustrates a structure including one hexacoordinate Sn atom and six tetracoordinate O atoms proximate to the Sn atom. In FIG. 22D, three tetracoordinate O atoms exist in each of an upper half and a lower half. In the small group illustrated in FIG. 22D, electric charge is +1.

FIG. 22E illustrates a small group including two Zn atoms. In FIG. 22E, one tetracoordinate O atom exists in each of an upper half and a lower half. In the small group illustrated in FIG. 22E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 22A each have three proximate In atoms in the downward direction, and the three O atoms in the lower half each have three proximate In atoms in the upward direction. The one O atom in the upper half with respect to the pentacoordinate Ga atom in FIG. 22B has one proximate Ga atom in the downward direction, and the one O atom in the lower half has one proximate Ga atom in the upward direction. The one O atom in the upper half with respect to the tetracoordinate Zn atom in FIG. 22C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 23A:
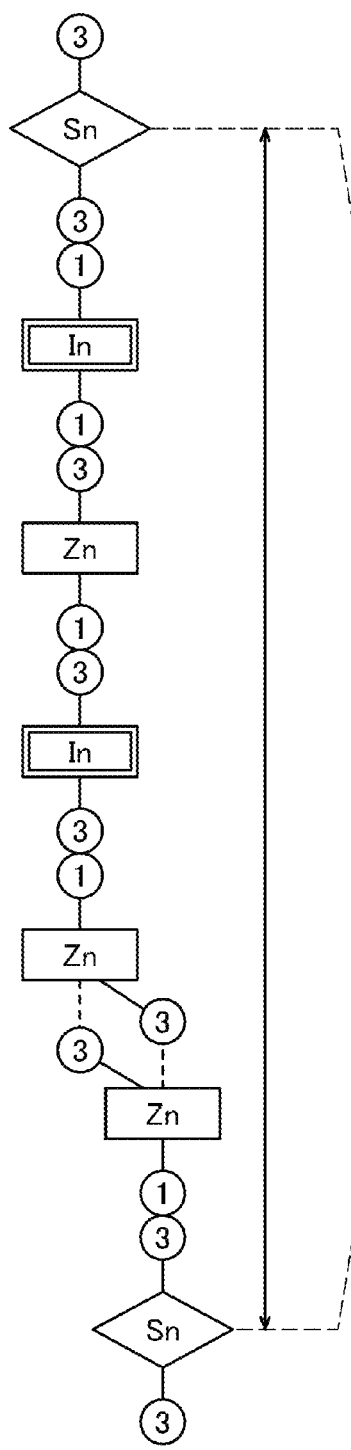
FIGS. 23A to 23C are diagrams illustrating a crystal structure of an oxide semiconductor according to one embodiment of the present invention.
Figure 23B:
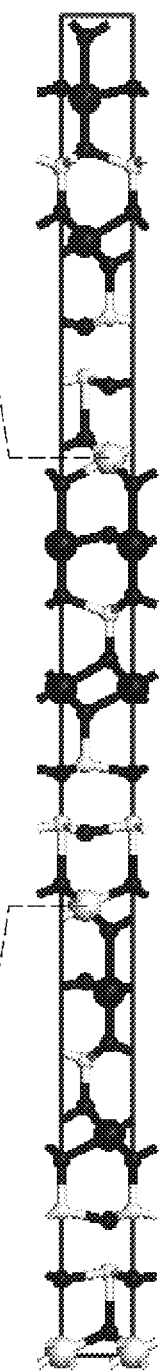
Figure 23C:

FIG. 23A illustrates a model of a medium group included in a layered structure of an In—Sn—Zn—O-based material. FIG. 23B illustrates a large group including three medium groups. Note that FIG. 23C illustrates an atomic arrangement in the case where the layered structure in FIG. 23B is observed from the c-axis direction.

In FIG. 23A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 23A, one tetracoordinate O atom existing in each of an upper half and a lower half with respect to an In atom is denoted by circled 1. FIG. 23A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 23A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 22E can be given. For example, with one small group including two Zn atoms, electric charge of one small group including a Sn atom can be cancelled, so that the total electric charge of the layered structure can be 0.

When the large group illustrated in FIG. 23B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZnO_6(ZnO)_m$ (m is a natural number).

The above-described rule also applies to the following oxides: a four-component metal oxide such as an In—Sn—Ga—Zn—O-based oxide; three-component metal oxides such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, and an In—Lu—Zn—O-based oxide; two-component metal oxides such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, and an In—Ga—O-based oxide; and the like.

Figure 24A:
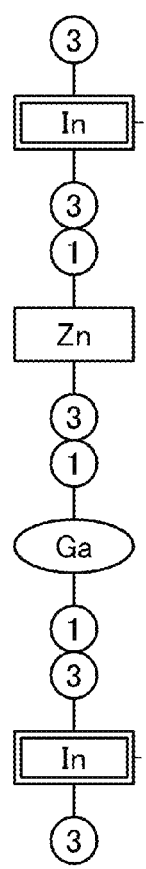
FIGS. 24A to 24C are diagrams illustrating a crystal structure of an oxide semiconductor according to one embodiment of the present invention.

As an example, FIG. 24A illustrates a model of a medium group included in a layered structure of an In—Ga—Zn—O-based oxide.

In the medium group included in the layered structure of the In—Ga—Zn—O-based oxide in FIG. 24A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 24B:
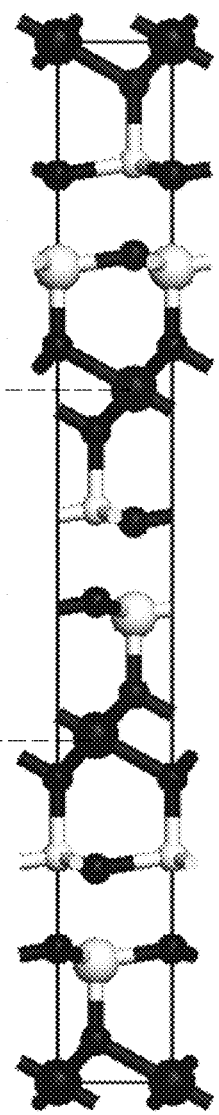
Figure 24C:
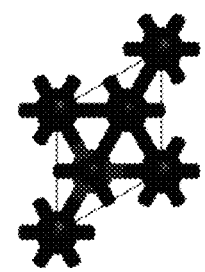

FIG. 24B illustrates a large group including three medium groups. Note that FIG. 24C illustrates an atomic arrangement in the case where the layered structure in FIG. 24B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based oxide, a large group can be formed using not only the medium group illustrated in FIG. 24A but also a medium group in which the arrangement of the In atom, the Ga atom, and the Zn atom is different from that in FIG. 24A.

When the large group illustrated in FIG. 24B is repeated, a crystal of an In—Ga—Zn—O-based oxide can be obtained. Note that a layered structure of the obtained In—Ga—Zn—O-based oxide can be expressed as a composition formula, $InGaO_3(ZnO)_n$ (n is a natural number).

Figure 25A:
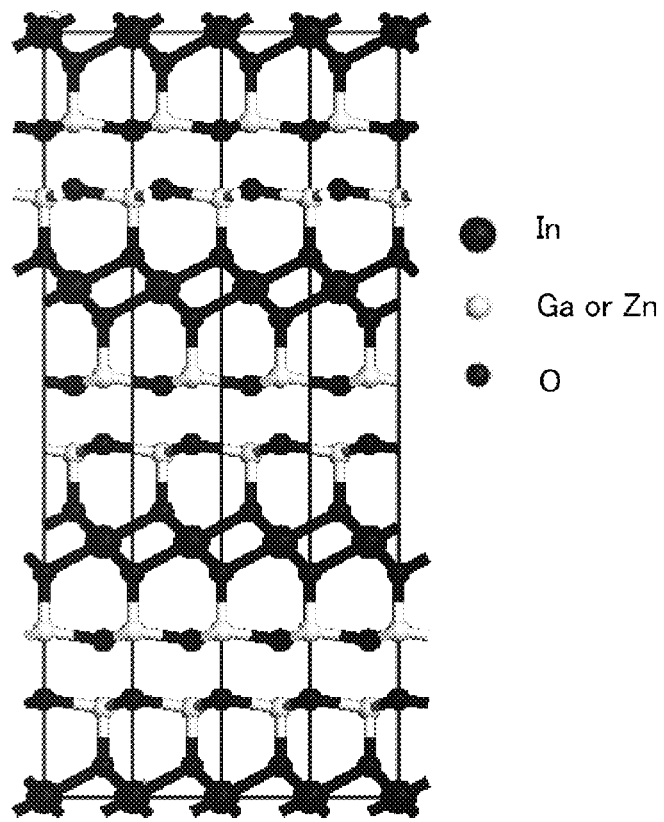
FIGS. 25A and 25B are diagrams each illustrating a crystal structure of an oxide semiconductor according to one embodiment of the present invention.

In the case where n=1 ($InGaZnO_4$), a crystal structure illustrated in FIG. 25A can be obtained, for example. Note that in the crystal structure in FIG. 25A, since a Ga atom and an In atom each have five ligands as illustrated in FIG. 22B, Ga can be replaced with In.

Figure 25B:
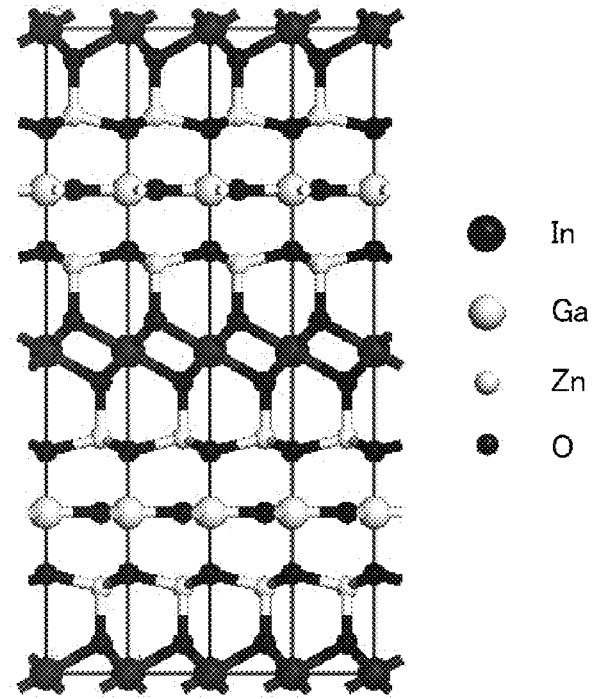

In the case where n=2 ($InGaZn_2O_5$), a crystal structure illustrated in FIG. 25B can be obtained, for example. Note that in the crystal structure in FIG. 25B, since a Ga atom and an In atom each have five ligands as described in FIG. 22B, Ga can be replaced with In.

The above is the description of the crystal parts included in the CAAC-OS film.

The oxide semiconductor film 256 is formed using a material whose band gap is 2.5 eV or more, preferably 2.8 eV or more, further preferably 3.0 eV or more in order to reduce the off-state current of the transistor.

Hydrogen which is an impurity for the oxide semiconductor partly serves as a donor to generate a carrier. Therefore, the concentration of hydrogen in the oxide semiconductor film 256 is lower than $5\times10^{18}$ atoms/cm$^3$, preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$.

Alkali metal is not an element included in an oxide semiconductor, and therefore, is an impurity. Also, alkaline earth metal is an impurity in the case where alkaline earth metal is not included in an oxide semiconductor. Alkali metals, in particular, sodium (Na) diffuses in an insulating film which is in contact with the oxide semiconductor film to become Na$^+$. In addition, in the oxide semiconductor film, Na cuts or enters a bond between metal and oxygen which are included in an oxide semiconductor. As a result, for example, deterioration of characteristics of the transistor such as a normally-on state of the transistor due to shift of a threshold voltage in the negative direction or a reduction in field-effect mobility occurs; in addition, variation in characteristics is also caused. Therefore, it is preferable to reduce the concentration of the impurity in the oxide semiconductor film. Specifically, it is preferable that the Na concentration which is measured by secondary ion mass spectrometry be lower than or equal to $5\times10^{16}$ cm$^3$, more preferably lower than or equal to $1\times10^{16}$ cm$^3$, still more preferably lower than or equal to $1\times10^{15}$ cm$^3$. In addition, the measurement value of the concentration of lithium (Li) is preferably lower than or equal to $5\times10^{15}$ atoms/cm$^3$, more preferably lower than or equal to $1\times10^{15}$ atoms/cm$^3$. Further, the measurement value of the concentration of potassium (K) is preferably lower than or equal to $5\times10^{15}$ atoms/cm$^3$, more preferably lower than or equal to $1\times10^{15}$ atoms/cm$^3$.

In the oxide semiconductor film 256, hydrogen, an alkali metal, an alkaline earth metal, and the like are reduced and the concentration of impurities is very low. Therefore, in a transistor whose channel region is formed using the oxide semiconductor film 256, off-state current can be reduced.

By using the oxide semiconductor film 256 described above, the off-state current of the transistor can be reduced. For example, the off-state current of the transistor where the channel length is 3 μm and the channel width is 1 μm can be less than or equal to $1\times10^{-18}$ A, less than or equal to $1\times10^{-21}$ A, or less than or equal to $1\times10^{-24}$ A.

Note that with an In—Sn—Zn—O-based oxide, high field-effect mobility can be obtained relatively easily. Specifically, the field-effect mobility of the transistor can be increased to 31 cm$^2$/Vs or more, 40 cm$^2$/Vs or more, 60 cm$^2$/Vs or more, 80 cm$^2$/Vs or more, or 100 cm$^2$/Vs or more. Further, even with any material (e.g., an In—Ga—Zn—O-based oxide) other than the In—Sn—Zn—O-based oxide, the field-effect mobility can be increased by reducing the defect density.

The field-effect mobility of a transistor will be described with reference to FIG. 26, FIGS. 27A to 27C, FIGS. 28A to 28C, and FIGS. 29A to 29C.

The field-effect mobility of a transistor tends to be measured lower than its inherent field-effect mobility for a variety of reasons; this phenomenon occurs not only in the case of using an oxide semiconductor. The field-effect mobility is decreased partly because a defect is formed inside a semiconductor or at an interface between the semiconductor and an insulating film. Here, the field-effect mobility on the assumption that no defect exists inside the semiconductor is calculated theoretically by using a Levinson model.

Assuming that the inherent field-effect mobility of the transistor is $\mu_0$ and a potential barrier (such as a grain boundary) exists in the semiconductor, the measured field-effect mobility μ is expressed by Formula 3.

$$\mu = \mu_0 \exp\left(-\frac{E}{kT}\right) \quad \text{[Formula 3]}$$

Here, E represents the height of the potential barrier, k represents the Boltzmann constant, and T represents the absolute temperature. Note that according to the Levinson model, the height of the potential barrier E is assumed to be attributed to a defect and is expressed by Formula 4.

$$E = \frac{e^2 N^2}{8\varepsilon n} = \frac{e^3 N^2 t}{8\varepsilon C_{ox} V_g} \quad \text{[Formula 4]}$$

Here, e represents the elementary charge, N represents the average defect density per unit area of a channel, ε represents the dielectric constant of the semiconductor, n represents the carrier density per unit area of a channel, $C_{ox}$ represents the capacitance of the gate insulating film per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer.

The drain current $I_d$ in a linear region is expressed by Formula 5.

$$\frac{I_d}{V_g} = \frac{W\mu V_d C_{ox}}{L} \exp\left(-\frac{E}{kT}\right) \quad \text{[Formula 5]}$$

Here, L represents the channel length and W represents the channel width, and L and W are each 10 μm. In addition, $V_d$ represents the drain voltage.

When taking logarithms of both sides of Formula 5, Formula 6 can be obtained.

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \quad \text{[Formula 6]}$$

The right side of Formula 6 is a function of $V_g$; thus, the defect density N can be obtained from the slope of an approximation line in a graph which is obtained by plotting actual measured values with $\ln(I_d/V_g)$ as the ordinate and $1/V_g$ as the abscissa. That is, the defect density N in the semiconductor can be obtained from the $V_g$-$I_d$ characteristics of the transistor.

Defect density N in a semiconductor depends on a substrate heating temperature in the formation of the semiconductor. In the case where the semiconductor is an oxide semiconductor formed using an In—Sn—Zn—O target of In:Sn:Zn=1:1:1 [atomic ratio], the defect density N in the oxide semiconductor is approximately $1\times10^{12}$/cm$^2$.

Calculating with Formulas 3 and 4 on the basis of the above defect density N in the oxide semiconductor, the inherent field-effect mobility of the transistor comes to be 120 cm$^2$/Vs. Thus, in an ideal transistor in which no defect exists inside the oxide semiconductor and at an interface between the oxide semiconductor and the gate insulating film that is in contact with the oxide semiconductor, the field-effect mobility $\mu_0$ is found to be 120 cm²/Vs. By contrast, in the case of using an oxide semiconductor with many defects, the field-effect mobility µ of a transistor is approximately 30 cm²/Vs.

Further, even when no defect exists inside the semiconductor, scattering at an interface between the channel and the gate insulating film adversely affects the transport properties of the transistor. The field-effect mobility $\mu_1$ at a position that is distance x away from the interface between the channel and the gate insulating film is expressed by Formula 7.

$$\frac{1}{\mu_1} = \frac{1}{\mu_0} + \frac{D}{B}\exp\left(-\frac{x}{l}\right)$$ [Formula 7]

Here, D represents the electric field intensity by the gate electrode, B represents a constant, and l represents the depth at which the adverse effect of scattering at the interface is caused. Values of B and l can be obtained from actual measurement of the electric characteristics of the transistor; according to actual measurement of the electric characteristics of the transistor including the above oxide semiconductor, B is 4.75×10⁷ cm/s and l is 10 nm. As D is increased, i.e., as $V_g$ is increased, the second term of Formula 7 increases and accordingly the field-effect mobility $\mu_1$ decreases.

Figure 26:
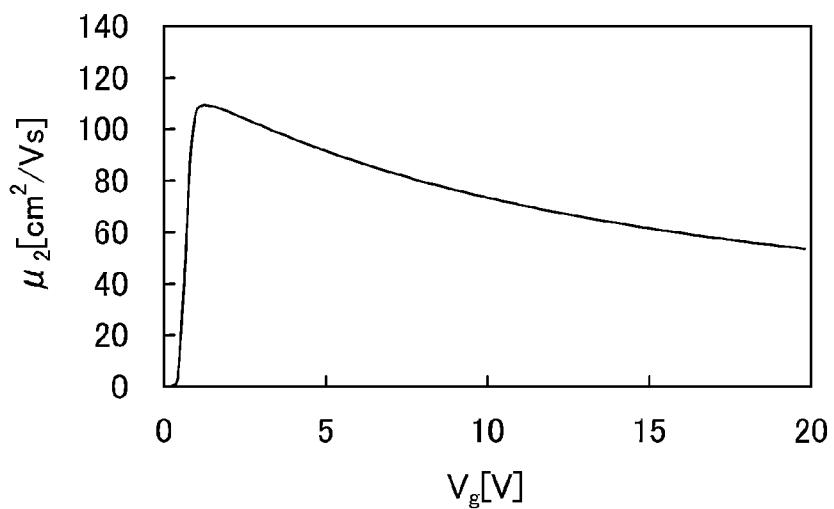
FIG. 26 is a graph showing $V_g$ dependence of field-effect mobility obtained by calculation.

FIG. 26 shows calculation results of the field-effect mobility $\mu_2$ of an ideal transistor in which no defect exists inside an oxide semiconductor and at an interface between the oxide semiconductor and a gate insulating film that is in contact with the oxide semiconductor. For the calculation, Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. Further, the work function of a gate is assumed to be 5.5 eV, and the work functions of a source and a drain were each assumed to be 4.6 eV. The thickness of the gate insulating film was assumed to be 100 nm, and the relative permittivity thereof was assumed to be 4.1. The channel length and the channel width were each assumed to be 10 µm and $V_d$ was assumed to be 0.1 V.

As shown in FIG. 26, the field-effect mobility $\mu_2$ has a peak of 100 cm²/Vs or more at $V_g$ of around 1 V and then decreases as $V_g$ becomes higher because the influence of interface scattering increases.

Calculation results in the case where such an ideal transistor is miniaturized are shown in FIGS. 27A to 27C, FIGS. 28A to 28C, and FIGS. 29A to 29C. Note that in the calculation, transistors having the structures illustrated in FIGS. 30A to 30C were assumed.

Figure 30A:
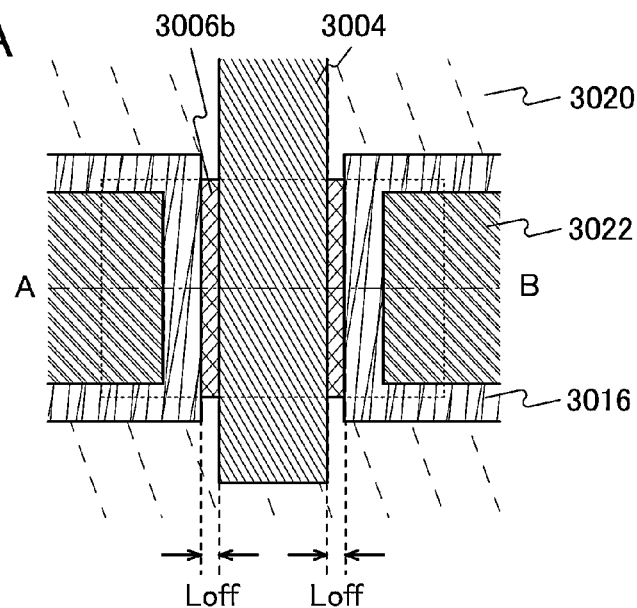
FIGS. 30A to 30C are a top view and cross-sectional views of transistors used for calculation.
Figure 30B:
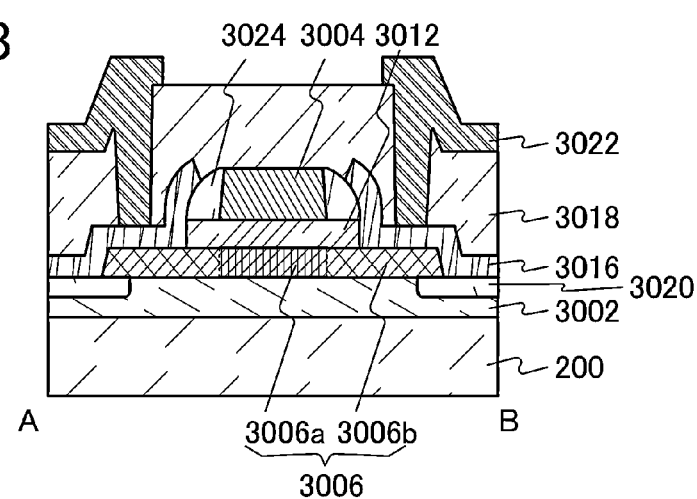

Next, the structures of the transistors illustrated in FIGS. 30A to 30C will be described. FIG. 30A is a top view of the transistor. FIG. 30B is a cross-sectional view along dashed-dotted line A-B in FIG. 30A.

The transistor illustrated in FIG. 30B includes a base insulating film 3002 provided over the substrate 200; a protective film 3020 provided on the periphery of the base insulating film 3002; an oxide semiconductor film 3006 which is provided over the base insulating film 3002 and the protective film 3020 and includes a high-resistance region 3006a and a low-resistance region 3006b; a gate insulating film 3012 provided over the oxide semiconductor film 3006; a gate electrode 3004 provided to overlap with the oxide semiconductor film 3006 with the gate insulating film 3012 provided therebetween; sidewall insulating films 3024 provided in contact with side surfaces of the gate electrode 3004; a pair of electrodes 3016 which is provided over the oxide semiconductor film 3006 and is at least partly in contact with the oxide semiconductor film 3006; a protective insulating film 3018 provided to cover the gate electrode 3004, the sidewall insulating film 3024, and the pair of electrodes 3016; and wirings 3022 which are provided in contact with the pair of electrodes 3016 through openings provided in the protective insulating film 3018.

Here, the resistivity of the low-resistance region 3006b was assumed to be 2×10⁻³ Ωcm, and the width of the gate electrode 3004, that of the sidewall insulating film 3024, and the channel width were assumed to be 33 nm, 5 nm, and 40 nm, respectively. The channel region is referred to as the high-resistance region 3006a for convenience, but the channel region was assumed to be an intrinsic semiconductor here.

Figure 27A:
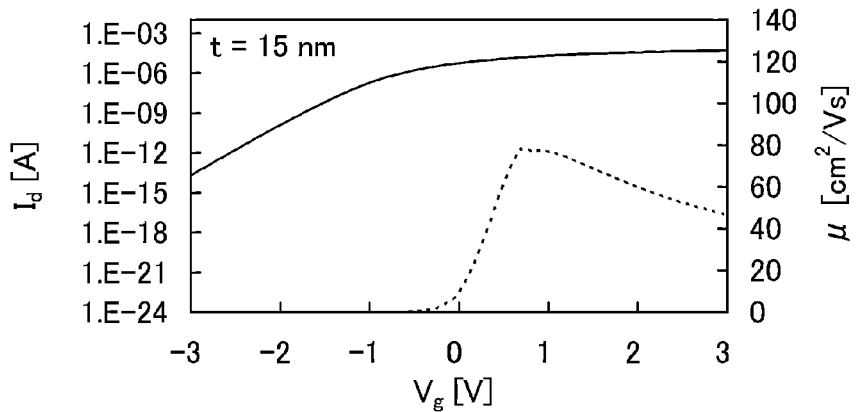
FIGS. 27A to 27C are graphs showing $V_g$ dependence of $I_d$ and field-effect mobility obtained by calculation.
Figure 27B:
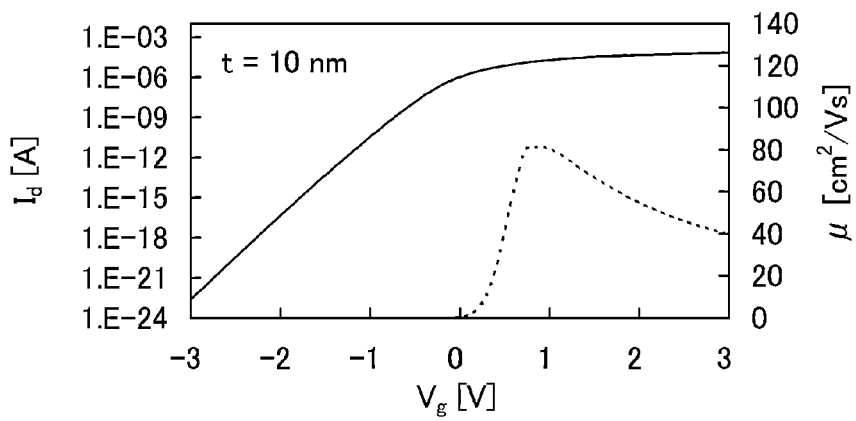
Figure 27C:
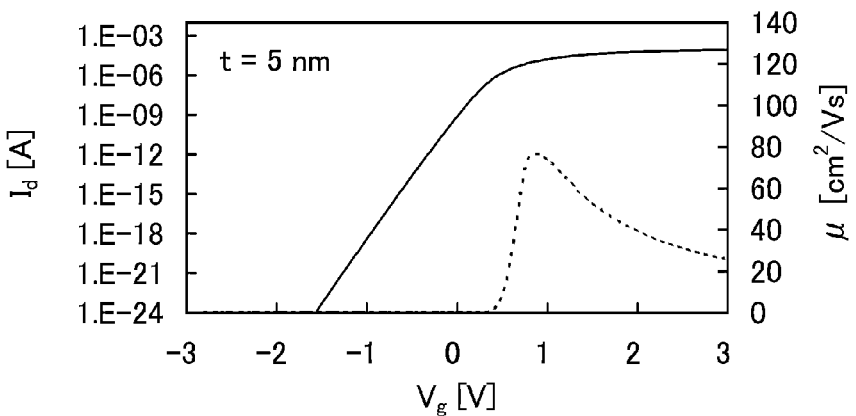

For the calculation, Sentaurus Device manufactured by Synopsys, Inc. was used. FIGS. 27A to 27C show $V_g$ dependence of $I_d$ (a solid line) and the field-effect mobility µ (a dotted line) of the transistor having the structure illustrated in FIG. 30B. Note that $I_d$ is obtained in the condition in which $V_d$ is 1 V and the field-effect mobility µ is obtained in the condition in which $V_d$ is 0.1 V. FIG. 27A shows the results where the thickness of the gate insulating film was 15 nm, FIG. 27B shows the results where the thickness of the gate insulating film was 10 nm, and FIG. 27C shows the results where the thickness of the gate insulating film was 5 nm.

FIGS. 27A to 27C show that as the gate insulating film becomes thinner, the drain current $I_d$ in an off state (here, in the range of $V_g$ from −3 V to 0 V) decreases. On the other hand, there is no noticeable change in the peak value of the field-effect mobility µ and the drain current $I_d$ in an on state (here, in the range of $V_g$ from 0 V to 3 V). FIGS. 27A to 27C show that $I_d$ exceeds 10 µA, which is requisite for a memory and the like that are semiconductor devices, at $V_g$ of around 1 V.

Figure 30C:
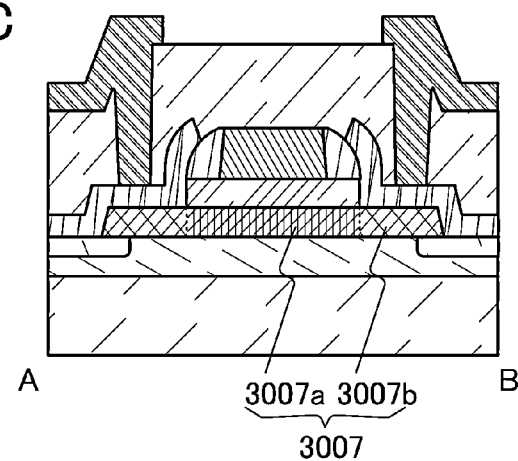

Similarly, the calculation was also conducted on the transistor illustrated in FIG. 30C. The transistor illustrated in FIG. 30C is different from the transistor illustrated in FIG. 30B in that an oxide semiconductor film 3007 including a high-resistance region 3007a and a low-resistance region 3007b is provided. Specifically, in the transistor illustrated in FIG. 30C, a region of the oxide semiconductor film 3007 which overlaps with the sidewall insulating film 3024 is included in the high-resistance region 3007a. The transistor is, in other words, a transistor having an offset region whose width is the same as the width of the sidewall insulating film 3024. Note that the width of the offset region is also referred to as an offset length (Loff) (see FIG. 30A). Note that Loff on the right side has the same width as Loff on the left side for convenience.

Figure 28A:
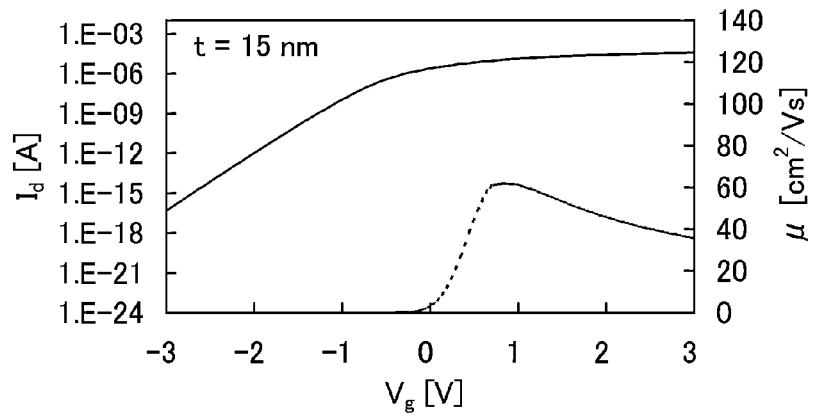
FIGS. 28A to 28C are graphs showing $V_g$ dependence of $I_d$ and field-effect mobility obtained by calculation.
Figure 28B:
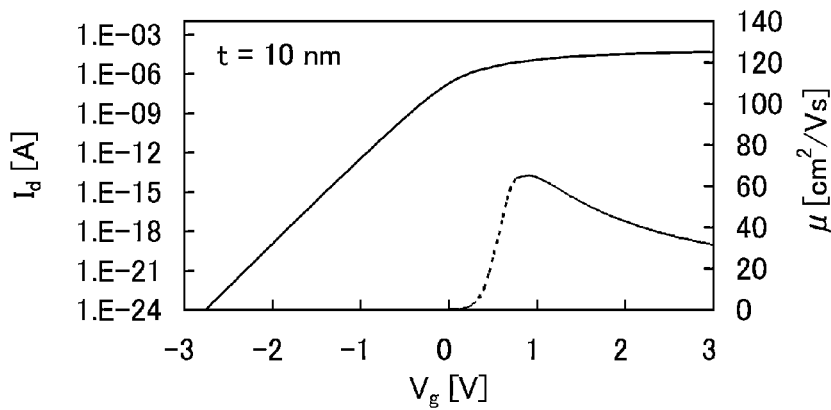
Figure 28C:
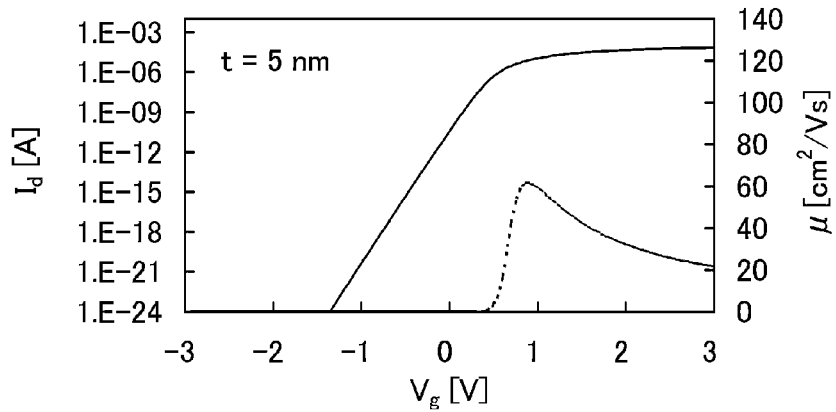

FIGS. 28A to 28C show $V_g$ dependence of the drain current $I_d$ (solid line) and the field-effect mobility µ (dotted line) of the transistor illustrated in FIG. 30C in which Loff is 5 nm. Note that $I_d$ was calculated at $V_d$ of 1 V and the field-effect mobility µ was calculated at $V_d$ of 0.1 V. FIG. 28A shows the results where the thickness of the gate insulating film was 15 nm, FIG. 28B shows the results where the thickness of the gate insulating film was 10 nm, and FIG. 28C shows the results where the thickness of the gate insulating film was 5 nm.

Figure 29A:
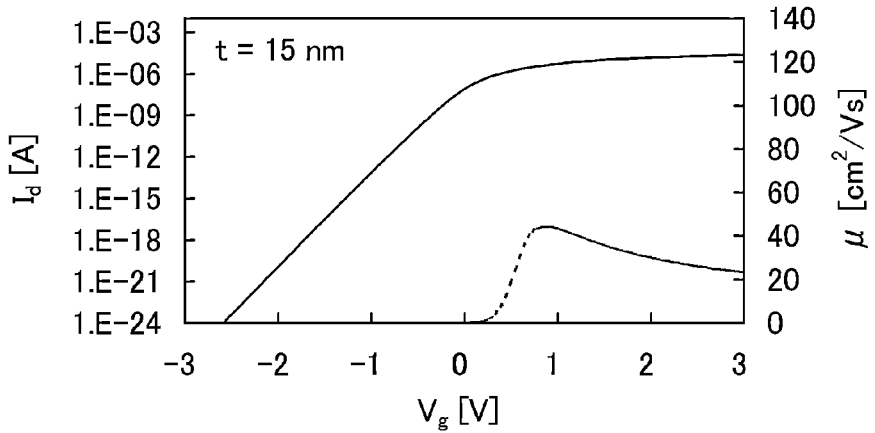
FIGS. 29A to 29C are graphs showing $V_g$ dependence of $I_d$ and field-effect mobility obtained by calculation.
Figure 29B:
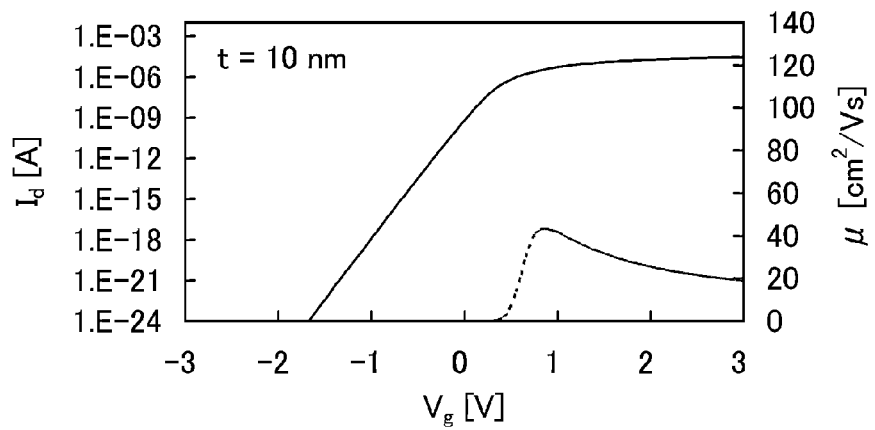
Figure 29C:
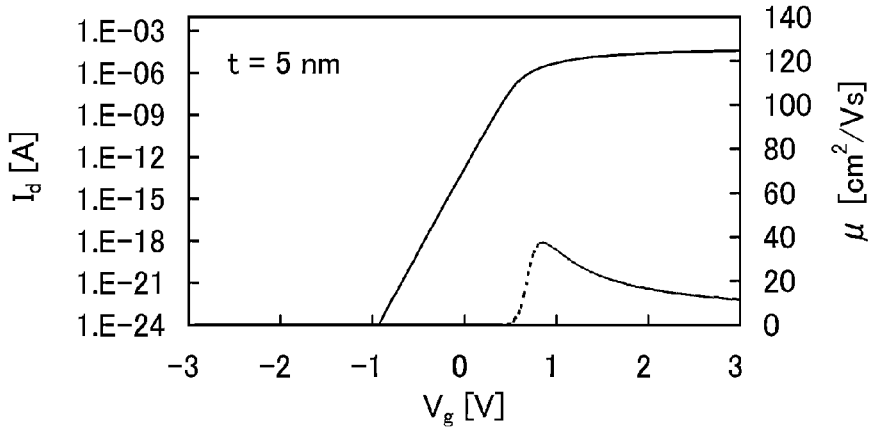

FIGS. 29A to 29C show $V_g$ dependence of the drain current $I_d$ (solid line) and the field-effect mobility µ (dotted line) of the transistor illustrated in FIG. 30C in which Loff is 15 nm. Note that $I_d$ was calculated at $V_d$ of 1 V and the field-effect mobility µ was calculated at $V_d$ of 0.1 V. FIG. 29A shows the results where the thickness of the gate insulating film was 15 nm, FIG. 29B shows the results where the thickness of the gate insulating film was 10 nm, and FIG. 29C shows the results where the thickness of the gate insulating film was 5 nm.

Both the calculation results in FIGS. 28A to 28C and those in FIGS. 29A to 29C show that, similarly to FIGS. 27A to 27C, as the gate insulating film becomes thinner, the drain current $I_d$ in an off state (here, in the range of $V_g$ from −3 V to 0 V) decreases. On the other hand, it is also found that there is no noticeable change in the peak value of the field-effect mobility and the drain current $I_d$ in an on state (here, in the range of $V_g$ from 0 V to 3 V).

Note that the peak of the field-effect mobility μ is approximately 80 cm$^2$/Vs in FIGS. 27A to 27C, approximately 60 cm$^2$/Vs in FIGS. 28A to 28C, and approximately 40 cm$^2$/Vs in FIGS. 29A to 29C; thus, the peak of the field-effect mobility μ decreases as the offset length Loff is increased. Further, it is that the same applies to $I_d$ in the off state. The drain current $I_d$ in an on state also decreases as the offset length Loff is increased; however, the decrease in the drain current $I_d$ in the on-state current is much more gradual than the decrease in the drain current $I_d$ in the off-state current. Any calculation result shows that $I_d$ exceeds 10 μA, which is requisite for a memory and the like, at $V_g$ of around 1 V.

The above is the description of the field-effect-mobility of the transistor.

Although the oxide semiconductor film 256 may be processed into an island shape, the oxide semiconductor film which is not processed into an island shape is described in this embodiment.

Next, first heat treatment is performed. By the first heat treatment, the degree of crystallinity of the oxide semiconductor film 256 is increased and/or the concentration of impurities in the oxide semiconductor film 256 can be reduced.

The first heat treatment is preferably performed in an oxidation atmosphere, an inert atmosphere, a reduced-pressure atmosphere, or a dry-air atmosphere at a temperature higher than or equal to 150° C. and lower than or equal to 650° C., preferably higher than or equal to 250° C. and lower than or equal to 500° C., more preferably higher than or equal to 300° C. and lower than or equal to 450° C. A resistance heating method, a method using a lamp heater, a method using a heated gas, or the like may be used in the first heat treatment.

Note that an oxidation atmosphere refers to an atmosphere containing an oxidation gas. Oxidation gas is oxygen, ozone, nitrous oxide, or the like, and it is preferable that the oxidation gas do not contain water, hydrogen, and the like. For example, the purity of oxygen, ozone, or nitrous oxide to be introduced to a heat treatment apparatus is greater than or equal to 8N (99.999999%), preferably greater than or equal to 9N (99.9999999%). The oxidation atmosphere may contain a mixed gas of an oxidation gas and an inert gas. In that case, the atmosphere contains an oxidation gas at a concentration of at least higher than or equal to 10 ppm.

The inert atmosphere contains an inert gas such as nitrogen or a rare gas as its main component. Specifically, in an inert atmosphere, the concentration of a reactive gas such as an oxidation gas is lower than 10 ppm.

A reduced-pressure atmosphere refers to an atmosphere with a pressure of a treatment chamber of lower than or equal to 10 Pa.

A dry-air atmosphere refers to an atmosphere with a dew point lower than or equal to −40° C., preferably lower than or equal to −50° C.

Next, an insulating film 262 is formed over the oxide semiconductor film 256.

The insulating film 262 may be formed with a single layer or a stack of layers using silicon oxide, silicon oxynitride, silicon nitride oxide, silicon nitride, aluminum oxide, hafnium oxide, yttrium oxide, zirconium oxide, YSZ (zirconium oxide stabilized by yttrium oxide), or the like.

Silicon oxynitride refers to a substance that contains a larger amount of oxygen than that of nitrogen. For example, silicon oxynitride contains oxygen, nitrogen, silicon, and hydrogen at concentrations in ranges of greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0 at. % and less than or equal to 10 at. %, respectively. In addition, silicon nitride oxide refers to a substance that contains a larger amount of nitrogen than that of oxygen. For example, silicon nitride oxide contains oxygen, nitrogen, silicon, and hydrogen at concentrations in ranges of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 25 at. %, respectively. Note that the above ranges are ranges for cases where measurement is performed using Rutherford backscattering spectrometry (RBS) and hydrogen forward scattering spectrometry (HFS). Moreover, the total of the percentages of the constituent elements does not exceed 100 at. %.

Figure 4C:
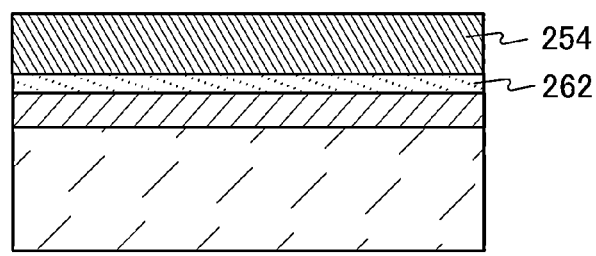

Next, a conductive film 254 is formed over the insulating film 262 (see FIG. 4C).

The conductive film 254 may be formed to have a single-layer structure or a stacked-layer structure using one or more of aluminum, titanium, chromium, cobalt, nickel, copper, yttrium, zirconium, molybdenum, silver, tantalum, and tungsten, a nitride of any of these elements, an oxide of any of these elements, and an alloy of any of these elements.

Next, the conductive film 254 is processed, so that a gate electrode 204 is formed.

Note that in this specification, for example, the expression "processing" means that a desired shape is obtained by a photolithography method or the like.

Figure 4D:
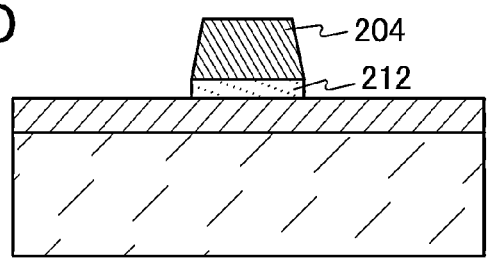

Next, the insulating film 262 is processed to have a top surface shape similar to that of the gate electrode 204, so that a gate insulating film 212 is formed (see FIG. 4D).

As the gate insulating film 212, a film from which oxygen atoms are released by heat treatment is preferably used. With the use of such a film from which oxygen atoms are released by heat treatment, defects generated in the channel region of the oxide semiconductor film can be repaired; thus, deterioration in electric characteristics of the transistor can be suppressed.

Figure 5A:
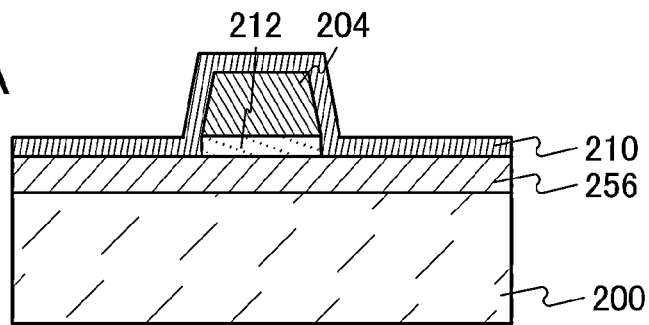
FIGS. 5A to 5C are cross-sectional views illustrating an example of a method for manufacturing a semiconductor device.

Next, a film 210 having a reducing property is formed over the oxide semiconductor film 256 and the gate electrode 204 (see FIG. 5A). The film 210 having a reducing property may be formed using, for example, the material of the film 110 having a reducing property described in Embodiment 1.

Figure 5B:
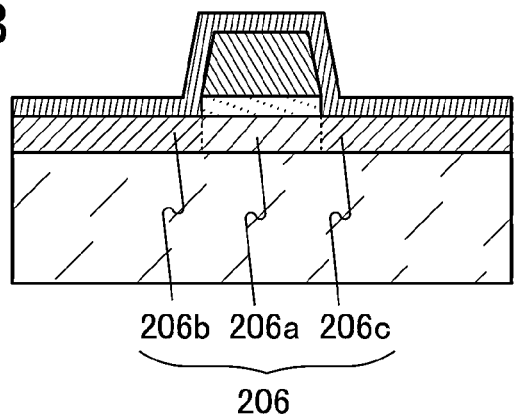

Next, in a region in contact with the film 210 having a reducing property, oxygen atoms in the oxide semiconductor film 256 are transferred to the film 210 having a reducing property, so that the oxide semiconductor film 206 including a first region 206a, a second region 206b, and a third region 206c is formed (see FIG. 5B).

Note that the first region 206a is a region of the oxide semiconductor film 256 from which oxygen atoms are not released, and each of the second region 206b and the third region 206c is a region of the oxide semiconductor film 256 from which part of oxygen atoms are released.

Also as described in Embodiment 1, each of the second region 206b and the third region 206c has a resistance lower than that of the first region 206a.

The first region 206a serves as a channel region of the transistor, and the second region 206b and the third region 206c serve as a source region and a drain region of the transistor.

In order to transfer oxygen atoms in the oxide semiconductor film 256 to the film 210 having a reducing property, second heat treatment is preferably performed. The second heat treatment is performed in an inert atmosphere or a reduced-pressure atmosphere at higher than or equal to 150° C. and lower than or equal to 650° C., preferably higher than or equal to 200° C. and lower than or equal to 450° C.

When the second heat treatment is performed in an inert atmosphere or a reduced-pressure atmosphere, change in quality of the film 210 having a reducing property due to an atmosphere can be suppressed. When the film 210 having a reducing property is changed in quality, it is in some cases difficult to remove the film 210 having a reducing property in a later step. In addition, when the film 210 having a reducing property remains without being removed, the electric characteristics of the transistor deteriorate in some cases.

Note that in the case where the film 210 having a reducing property has a sufficient reducing property even at room temperature, the second heat treatment becomes unnecessary.

The second heat treatment may also serve as the first heat treatment. In that case, the first heat treatment is not necessarily performed.

Figure 5C:
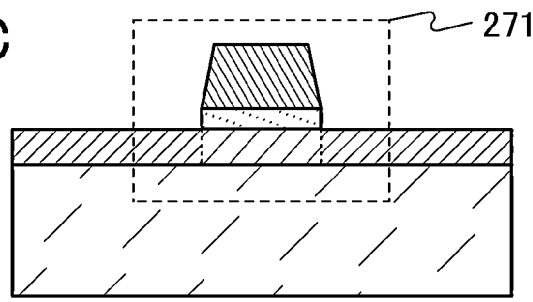

Next, the film 210 having a reducing property is removed (see FIG. 5C).

The film 210 having a reducing property is removed in a condition that the selectivity of the film 210 having a reducing property with respect to the gate electrode 204, the gate insulating film 212, and the oxide semiconductor film 206 is sufficiently high.

The condition that the selectivity is sufficiently high means that the etching rate of another film is ½ or less, preferably ⅒ or less, more preferably ¹⁄₂₀ or less of the etching rate of the film 210 having a reducing property.

In the case where a reaction product is generated on exposed surfaces of the gate electrode 204, the gate insulating film 212, and the oxide semiconductor film 206 when the film 210 having a reducing property is removed, treatment for removing the reaction product is preferably performed.

The removal of the film 210 having a reducing property may be performed by a dry etching method, a wet etching method, or a combination of a dry etching method and a wet etching method.

In the case where the film 210 having a reducing property is not removed and is insulated, it is difficult for the film 210 having a reducing property to react completely. Thus, the film 210 having a reducing property which does not react or not reacts completely degrades the electric characteristics in some cases.

Through the above steps, a transistor 271 which includes the oxide semiconductor film 206 including the first region 206a, the second region 206b, and the third region 206c over the substrate 200, the gate insulating film 212 over the oxide semiconductor film 206, and the gate electrode 204 over the oxide semiconductor film 206 with the gate insulating film 212 provided therebetween can be manufactured (see FIG. 5C).

Note that third heat treatment is preferably performed after the transistor 271 is manufactured. The third heat treatment may be performed by a method similar to that of the second heat treatment.

Note that the transistor 271 is provided with sidewall insulating films, and an LDD structure may be employed in which regions of the oxide semiconductor film 206, which overlap with the sidewall insulating films, serve as LDD regions. A method for manufacturing a transistor having an LDD structure will be described below.

For a manufacturing method up to and including the step in FIG. 5C, the manufacturing method of the transistor 271 is referred to.

Figure 6A:
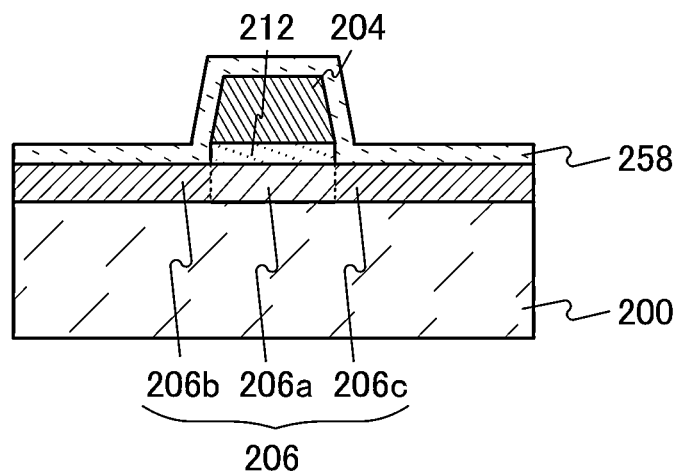
FIGS. 6A and 6B are cross-sectional views illustrating an example of a method for manufacturing a semiconductor device.

First, an insulating film 258 is formed over the oxide semiconductor film 206 and the gate electrode 204 (see FIG. 6A).

The insulating film 258 may be formed using a method and a material similar to those of the insulating film 262.

Next, the insulating film 258 is processed, so that sidewall insulating films 208 are formed. The sidewall insulating films 208 are provided in contact with respective sidewalls of the gate electrode 204.

The sidewall insulating films 208 may be formed in a self-aligned manner by performing highly anisotropic etching on the insulating film 258 after the insulating film 258 is formed. As highly anisotropic etching, for example, dry etching is preferably performed. As an etching gas used for dry etching, for example, a gas containing fluorine such as trifluoromethane, octafluorocyclobutane, or tetrafluoromethane can be used. A rare gas or hydrogen may be added to the etching gas. As the dry etching, a reactive ion etching (RIE) method in which high-frequency voltage is applied to a substrate, is preferably used.

Figure 6B:
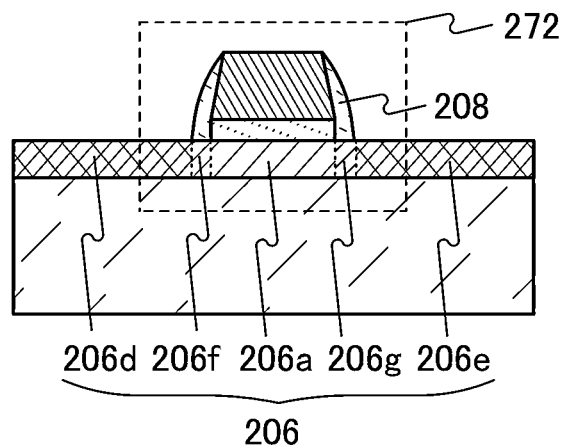

Next, an impurity which reduces the resistance of the oxide semiconductor film is added to the oxide semiconductor film 206 using the gate electrode 204 and the sidewall insulating films 208 as masks, so that the oxide semiconductor film 206 including the first region 206a, a fourth region 206d, a fifth region 206e, a sixth region 206f, and a seventh region 206g is formed (see FIG. 6B).

As the impurity which reduces the resistance of the oxide semiconductor film, specifically, a material which generates a carrier in the oxide semiconductor film can be used.

For example, as the impurity which reduces the resistance of the oxide semiconductor film, one or more of hydrogen, helium, boron, nitrogen, fluoride, neon, aluminum, phosphorus, argon, arsenic, krypton, indium, tin, antimony, and xenon may be used.

As the impurity which reduces the resistance of the oxide semiconductor film, boron or phosphorus is preferably used. Boron or phosphorus can reduce the resistance of an oxide semiconductor film even when the concentration thereof is relatively low.

Note that the sidewall insulating films 208 can prevent the impurity which reduces the resistance of the oxide semiconductor film from diffusing in the channel region of the oxide semiconductor film 206 (here, the first region 206a). Therefore, the deterioration in electric characteristics of a miniaturized transistor can be suppressed.

The oxide semiconductor film 206 including the first region 206a, the fourth region 206d, the fifth region 206e, the sixth region 206f, and the seventh region 206g may be formed in such a manner that an impurity which reduces the resistance of the oxide semiconductor film is added to the oxide semiconductor film 206 through the insulating film 258 before the insulating film 258 is processed. In that case, the insulating film 258 is processed after the oxide semiconductor film 206 including the first region 206a, the fourth region 206d, the fifth region 206e, the sixth region 206f, and the seventh region 206g is formed, whereby the sidewall insulating films 208 are formed. Alternatively, the insulating film 258 may be removed without formation of the sidewall insulating films 208, or a transistor may be formed with the insulating film 258 remaining.

Fourth heat treatment may be performed after the impurity which reduces the resistance of the oxide semiconductor film is added to the oxide semiconductor film 206. The fourth heat treatment may be performed by a method similar to that of the first heat treatment or the second heat treatment. Note that the fourth heat treatment may also serve as the first heat treatment.

The fourth region 206d and the fifth region 206e are regions whose resistances are further reduced by adding the impurity which reduces the resistance of the oxide semiconductor film to the second region 206b and the third region 206c.

The sixth region 206f and the seventh region 206g are regions which have resistances similar to those of the second region 206b and the third region 206c.

Here, the fourth region 206d and the fifth region 206e serve as a source region and a drain region of the transistor. The sixth region 206f and the seventh region 206g serve as LDD regions of the transistor.

The LDD region has a sheet resistance of greater than or equal to 1 k$\Omega$/sq. and less than or equal to 100 M$\Omega$/sq., preferably greater than or equal to 10 k$\Omega$/sq. and less than or equal to 50 M$\Omega$/sq., more preferably greater than or equal to 100 k$\Omega$/sq. and less than or equal to 20 M$\Omega$/sq.

Through the above steps, a transistor 272 including the LDD regions can be manufactured (see FIG. 6B).

The third heat treatment is preferably performed after the transistor 272 is manufactured.

With the LDD regions, degradation of the transistor, such as hot carrier degradation, is reduced, and shift of the threshold voltage in the negative direction due to a short channel length can be suppressed.

Next, a method for manufacturing a transistor including LDD regions without a step of providing sidewall insulating films will be described.

For a manufacturing method up to and including the step in FIG. 4D, the manufacturing method of the transistor 271 is referred to.

Figure 7A:
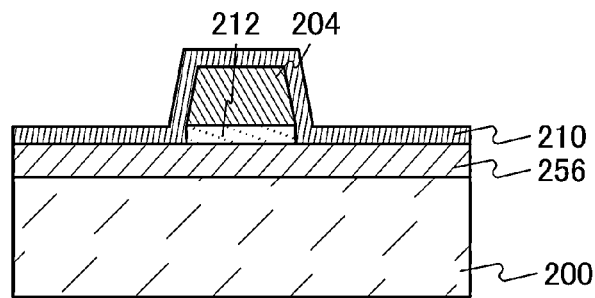
FIGS. 7A to 7C are cross-sectional views illustrating an example of a method for manufacturing a semiconductor device.

First, the film 210 having a reducing property is formed over the oxide semiconductor film 256 and the gate electrode 204 (see FIG. 7A).

Figure 7B:
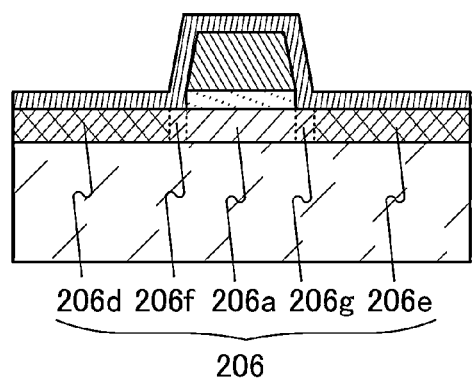

Next, an impurity which reduces the resistance of the oxide semiconductor film is added to the oxide semiconductor film 256 through the film 210 having a reducing property, and then, part of oxygen atoms are released from a region of the oxide semiconductor film 256 in contact with the film 210 having a reducing property, whereby the oxide semiconductor film 206 including the first region 206a, the fourth region 206d, the fifth region 206e, the sixth region 206f, and the seventh region 206g is formed (see FIG. 7B).

Alternatively, part of oxygen atoms are released from the region of the oxide semiconductor film 256 in contact with the film 210 having a reducing property, and then, an impurity which reduces the resistance of the oxide semiconductor film is added to the oxide semiconductor film 256 through the film 210 having a reducing property, whereby the oxide semiconductor film 206 including the first region 206a, the fourth region 206d, the fifth region 206e, the sixth region 206f, and the seventh region 206g is formed (see FIG. 7B).

Note that when the impurity which reduces the resistance of the oxide semiconductor film is added to the oxide semiconductor film 256 through the film 210 having a reducing property, part of a material included in the film 210 having a reducing property is transferred to the oxide semiconductor film 256 in some cases. In that case, the resistance of the oxide semiconductor film 256 can be further reduced.

Note that regions of the oxide semiconductor film to which the impurity which reduces the resistance of the oxide semiconductor film is not added are wider than those in the case where the film having a reducing property is not provided due to the film 210 having a reducing property which is formed on sidewalls of the gate electrode 204. The regions (corresponding to the sixth region 206f and the seventh region 206g) can be LDD regions.

Here, the first region 206a serves as a channel region of the transistor, and the fourth region 206d and the fifth region 206e serve as a source region and a drain region of the transistor.

The second heat treatment is preferably performed in order to release part of oxygen atoms from the region of the oxide semiconductor film 256 in contact with the film 210 having a reducing property.

Figure 7C:
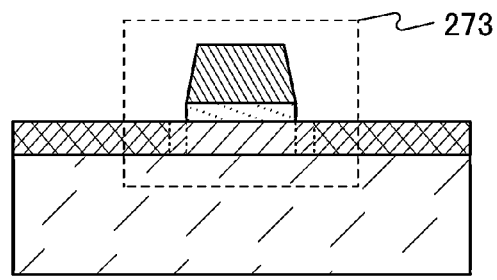

Next, the film 210 having a reducing property is removed (see FIG. 7C).

Through the above steps, a transistor 273 including the LDD regions can be manufactured (see FIG. 7C).

The third heat treatment is preferably performed after the transistor 273 is manufactured.

Next, a method for manufacturing a transistor which is different from the transistors 271 to 273 will be described.

For a manufacturing method up to and including the step in FIG. 4D, the manufacturing method of the transistor 271 is referred to.

Figure 8A:
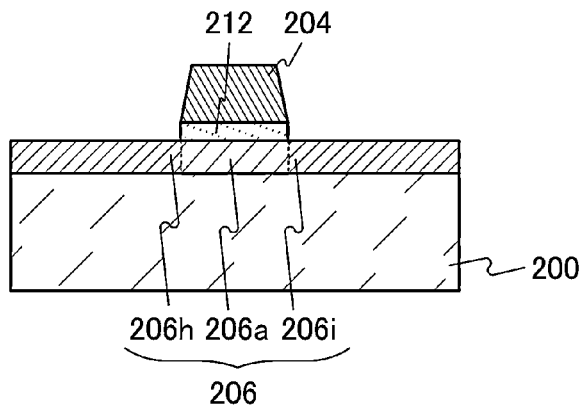
FIGS. 8A to 8D are cross-sectional views illustrating an example of a method for manufacturing a semiconductor device.

First, an impurity which reduces the resistance of the oxide semiconductor film is added to the oxide semiconductor film 256 using the gate electrode 204 as a mask, whereby the oxide semiconductor film 206 including the first region 206a, an eighth region 206h, and a ninth region 206i is formed (see FIG. 8A).

The fourth heat treatment may be performed after the impurity which reduces the resistance of the oxide semiconductor film is added to the oxide semiconductor film 256.

The eighth region 206h and the ninth region 206i each contain the impurity which reduces the resistance of the oxide semiconductor film. Therefore, the eighth region 206h and the ninth region 206i each have a resistance lower than that of the first region 206a.

Figure 8B:
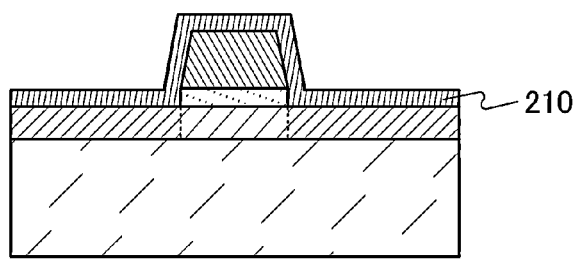

Next, the film 210 having a reducing property is formed over the oxide semiconductor film 206 and the gate electrode 204 (see FIG. 8B).

Figure 8C:
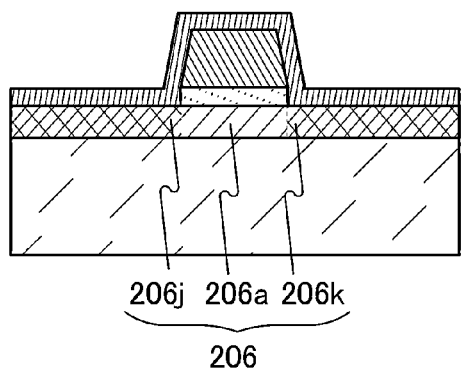

Next, part of oxygen atoms are transferred from the oxide semiconductor film 206 to the film 210 having a reducing property, whereby the oxide semiconductor film 206 including a tenth region 206j and an eleventh region 206k is formed (see FIG. 8C).

The second heat treatment is preferably performed in order to release part of oxygen atoms from a region of the oxide semiconductor film 206 in contact with the film 210 having a reducing property.

The tenth region 206j and the eleventh region 206k are regions of the eighth region 206h and the ninth region 206i from which part of oxygen atoms are released. Therefore, the tenth region 206j and the eleventh region 206k have resistances lower than those of the eighth region 206h and the ninth region 206i.

Here, the first region 206a serves as a channel region of the transistor, and the tenth region 206j and the eleventh region 206k serve as a source region and a drain region of the transistor.

Figure 8D:
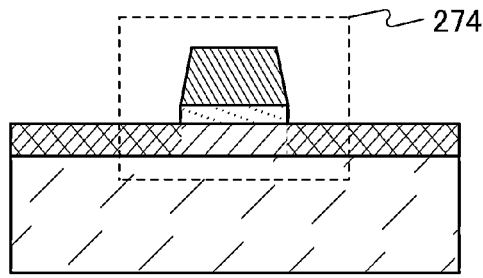

Next, the film 210 having a reducing property is removed (see FIG. 8D).

Through the above steps, a transistor 274 can be manufactured (see FIG. 8D).

The third heat treatment is preferably performed after the transistor 274 is manufactured.

Note that in FIGS. 8A to 8D, the gate insulating film 212 is processed to have a top surface shape similar to that of the gate electrode 204, and then treatment for reducing the resistance of the oxide semiconductor film 256 is performed; however, the steps are not limited thereto. For example, an impurity which reduces the resistance of the oxide semiconductor film may be added to the oxide semiconductor film 256 through the insulating film 262. In that case, the gate insulating film 212 is formed in such a manner that the insulating film 262 is processed before the film 210 having a reducing property is formed.

Next, a method for manufacturing a transistor including Loff regions will be described.

For a manufacturing method up to and including the step in FIG. 4D, the manufacturing method of the transistor 271 is referred to.

Figure 9A:
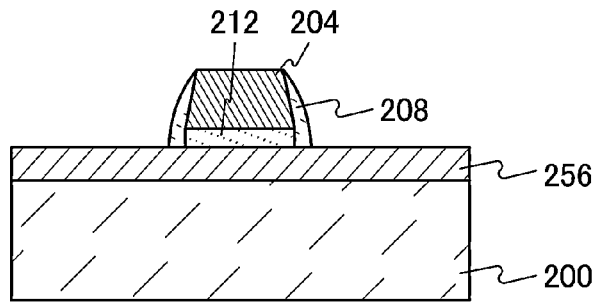
FIGS. 9A to 9D are cross-sectional views illustrating an example of a method for manufacturing a semiconductor device.

First, the sidewall insulating films 208 are formed in contact with respective sidewalls of the gate electrode 204 (see FIG. 9A). For a method for forming the sidewall insulating films 208, the steps in FIGS. 6A and 6B is referred to.

Figure 9B:
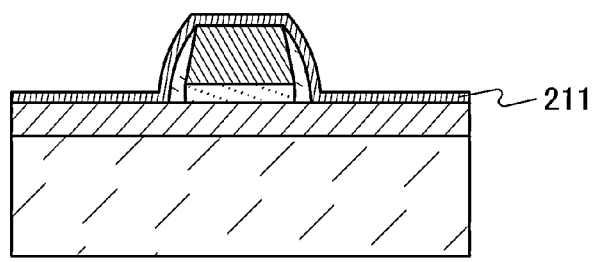

Next, a film 211 having a reducing property is formed over the oxide semiconductor film 256, the gate electrode 204, and the sidewall insulating films 208 (see FIG. 9B).

Note that the film 211 having a reducing property may be formed using a material similar to that of the film 210 having a reducing property.

Figure 9C:
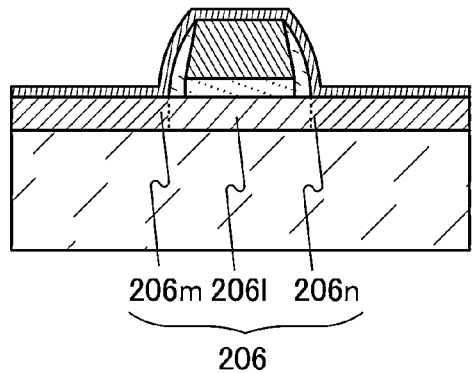

Next, part of oxygen atoms are transferred from the oxide semiconductor film 256 to the film 211 having a reducing property, whereby the oxide semiconductor film 206 including a twelfth region 206l, a thirteenth region 206m, and a fourteenth region 206n is formed (see FIG. 9C).

Note that the sidewall insulating films 208 can prevent the film 211 having a reducing property from affecting a channel region of the oxide semiconductor film 206 (here, the twelfth region 206l). Therefore, the deterioration in electric characteristics of a miniaturized transistor can be suppressed.

The second heat treatment is preferably performed in order to release part of oxygen atoms from a region of the oxide semiconductor film 256 in contact with the film 211 having a reducing property.

The twelfth region 206l is a region of the oxide semiconductor film 256 from which oxygen atoms are not released, and the thirteenth region 206m and the fourteenth region 206n are regions of the oxide semiconductor film 256 from which part of oxygen atoms are released.

Also as described in Embodiment 1, here, each of the thirteenth region 206m and the fourteenth region 206n has a resistance lower than that of the twelfth region 206l.

Here, the twelfth region 206l serves as a channel region of the transistor, and the thirteenth region 206m and the fourteenth region 206n serve as a source region and a drain region of the transistor.

Here, the twelfth region 206l is larger than the first region 206a by regions overlapping with the respective sidewall insulating films 208. The regions of the oxide semiconductor film 206, which overlap with the respective sidewall insulating films 208, serve as Loff regions.

With the Loff regions, degradation of the transistor, such as hot carrier degradation, is reduced, and shift of the threshold voltage in the negative direction due to a short channel length can be suppressed.

Figure 9D:
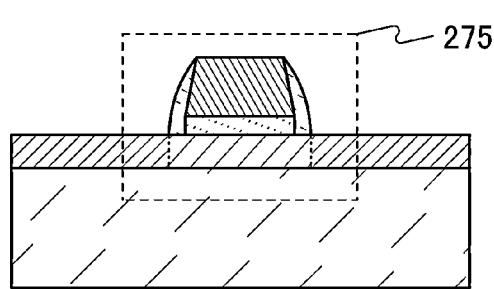

Next, the film 211 having a reducing property is removed (see FIG. 9D).

With the sidewall insulating films 208, a short-circuit between the gate electrode 204 and the source and drain regions hardly occurs and factors of degrading the electric characteristics of the transistor can be reduced even in the case where the film 211 having a reducing property is not completely removed.

Through the above steps, a transistor 275 can be manufactured (see FIG. 9D).

The third heat treatment is preferably performed after the transistor 275 is manufactured.

Next, a method for manufacturing a transistor including Loff regions, which is different from the transistor 275, will be described.

For a manufacturing method up to and including the step in FIG. 9A, the manufacturing method of the transistor 275 is referred to.

Figure 10A:
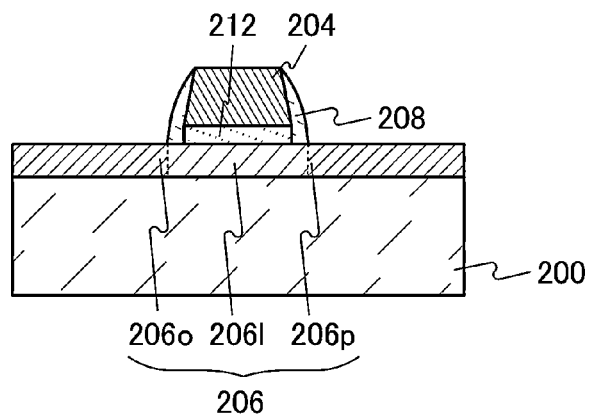
FIGS. 10A to 10D are cross-sectional views illustrating an example of a method for manufacturing a semiconductor device.

First, an impurity which reduces the resistance of the oxide semiconductor film is added to the oxide semiconductor film 256 using the gate electrode 204 and the sidewall insulating films 208 as masks, so that the oxide semiconductor film 206 including the twelfth region 206l, a fifteenth region 206o, and a sixteenth region 206p is formed (see FIG. 10A).

The fourth heat treatment may be performed after the impurity which reduces the resistance of the oxide semiconductor film is added to the oxide semiconductor film 256.

Figure 10B:
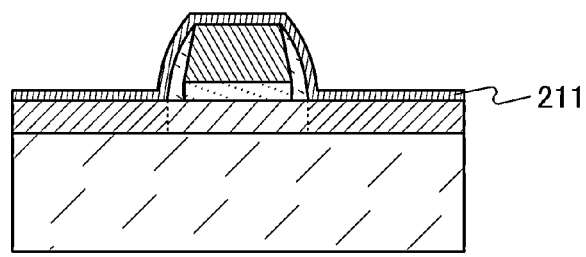

Next, the film 211 having a reducing property is formed over the oxide semiconductor film 206, the gate electrode 204, and the sidewall insulating films 208 (see FIG. 10B).

Figure 10C:
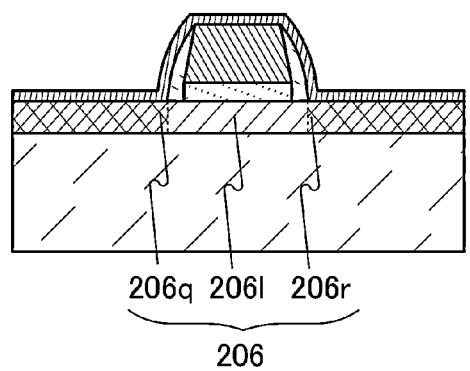

Next, part of oxygen atoms are transferred from the oxide semiconductor film 206 to the film 211 having a reducing property, so that the oxide semiconductor film 206 including the twelfth region 206l, a seventeenth region 206q, and an eighteenth region 206r is formed (see FIG. 10C).

The seventeenth region 206q and the eighteenth region 206r are regions of the fifteenth region 206o and the sixteenth region 206p from which part of oxygen atoms are released. Therefore, the seventeenth region 206q and the eighteenth region 206r have resistances lower than those of the fifteenth region 206o and the sixteenth region 206p.

Here, the twelfth region 206l serves as a channel region of the transistor, and the seventeenth region 206q and the eighteenth region 206r serve as a source region and a drain region of the transistor.

Here, the twelfth region 206l is larger than the first region 206a by regions overlapping with the respective sidewall insulating films 208. The regions of the oxide semiconductor film 206, which overlap with the respective sidewall insulating films 208, serve as Loff regions.

Note that the sidewall insulating films 208 can prevent the impurity which reduces the resistance of the oxide semiconductor film from diffusing into a channel region of the oxide semiconductor film 206 (here, the twelfth region 206l). In addition, the sidewall insulating films 208 can prevent the film 211 having a reducing property from affecting the channel region of the oxide semiconductor film 206. Therefore, the deterioration in electric characteristics of a miniaturized transistor can be suppressed.

Figure 10D:
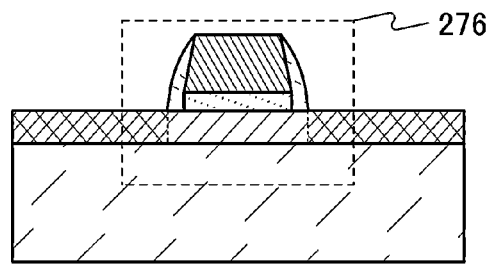

Next, the film 211 having a reducing property is removed (see FIG. 10D).

With the sidewall insulating films 208, a short-circuit between the gate electrode 204 and the source and drain regions hardly occurs and factors of degrading the electric characteristics of the transistor can be reduced even in the case where the film 211 having a reducing property is not completely removed when the film 211 having a reducing property is removed.

Through the above steps, a transistor 276 can be manufactured (see FIG. 10D).

The third heat treatment is preferably performed after the transistor 276 is manufactured.

Next, a method for manufacturing a transistor including Loff regions and LDD regions will be described.

For a manufacturing method up to and including the step in FIG. 9B, the manufacturing method of the transistor 275 is referred to.

Figure 11A:
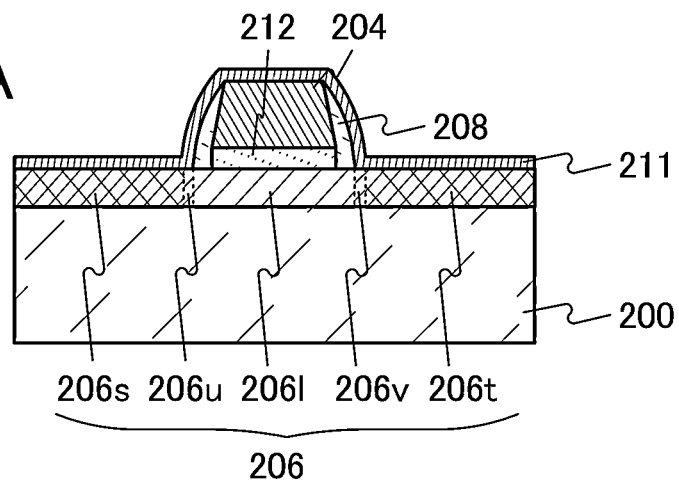
FIGS. 11A and 11B are cross-sectional views illustrating an example of a method for manufacturing a semiconductor device.

First, an impurity which reduces the resistance of the oxide semiconductor film is added to the oxide semiconductor film 256 through the film 211 having a reducing property, and then, part of oxygen atoms are released from a region of the oxide semiconductor film 256 in contact with the film 211 having a reducing property, whereby the oxide semiconductor film 206 including the twelfth region 206*l*, a nineteenth region 206*s*, a twentieth region 206*t*, a twenty-first region 206*u*, and a twenty-second region 206*v* is formed (see FIG. 11A).

Alternatively, part of oxygen atoms are released from the region of the oxide semiconductor film 256 in contact with the film 211 having a reducing property, and then, an impurity which reduces the resistance of the oxide semiconductor film is added to the oxide semiconductor film 256 through the film 211 having a reducing property, whereby the oxide semiconductor film 206 including the twelfth region 206*l*, the nineteenth region 206*s*, the twentieth region 206*t*, the twenty-first region 206*u*, and the twenty-second region 206*v* is formed (see FIG. 11A).

Note that when the impurity which reduces the resistance of the oxide semiconductor film is added to the oxide semiconductor film 256 through the film 211 having a reducing property, part of a material included in the film 211 having a reducing property is transferred to the oxide semiconductor film 256 in some cases. In that case, the resistance of the oxide semiconductor film 256 can be further reduced.

Here, the twelfth region 206*l* serves as a channel region of the transistor, and the nineteenth region 206*s* and the twentieth region 206*t* serve as a source region and a drain region of the transistor.

Note that regions of the oxide semiconductor film to which the impurity which reduces the resistance of the oxide semiconductor film is not added are wider than those in the case where the film having a reducing property is not provided due to the film 211 having a reducing property which is formed on sidewalls of the sidewall insulating films 208. The regions (corresponding to the twenty-first region 206*u* and the twenty-second region 206*v*) can be LDD regions.

In addition, the twelfth region 206*l* is larger than the first region 206*a* by regions overlapping with the respective sidewall insulating films 208. The regions of the oxide semiconductor film 206, which overlap with the respective sidewall insulating films 208, serve as Loff regions.

Note that the sidewall insulating films 208 can prevent the impurity which reduces the resistance of the oxide semiconductor film from diffusing into a channel region of the oxide semiconductor film 206 (here, the twelfth region 206*l*). In addition, the sidewall insulating films 208 can prevent the film 211 having a reducing property from affecting the channel region of the oxide semiconductor film 206. Therefore, the deterioration in electric characteristics of a miniaturized transistor can be suppressed.

Figure 11B:
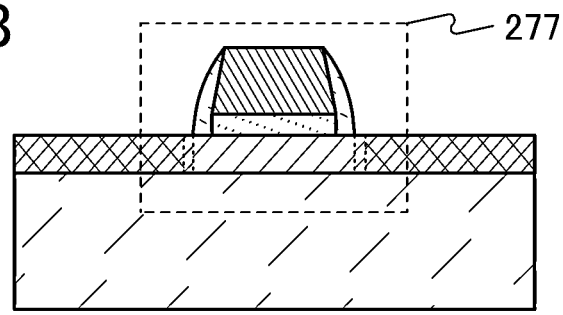

Next, the film 211 having a reducing property is removed (see FIG. 11B).

With the sidewall insulating films 208, a short-circuit between the gate electrode 204 and the source and drain regions hardly occurs and factors of degrading the electric characteristics of the transistor can be reduced even in the case where the film 211 having a reducing property is not completely removed.

Through the above steps, a transistor 277 including the Loff regions and the LDD regions can be manufactured (see FIG. 11B).

The third heat treatment is preferably performed after the transistor 277 is manufactured.

Since the transistor 277 includes the Loff regions and the LDD regions, degradation of the transistor, such as hot carrier degradation, can be reduced and shift of the threshold voltage in the negative direction due to a short channel length can be suppressed, as compared to a transistor including only LDD or Loff regions.

Next, an example of a manufacturing method up to and including a step of forming a wiring after the transistor is manufactured will be described.

Figure 12A:
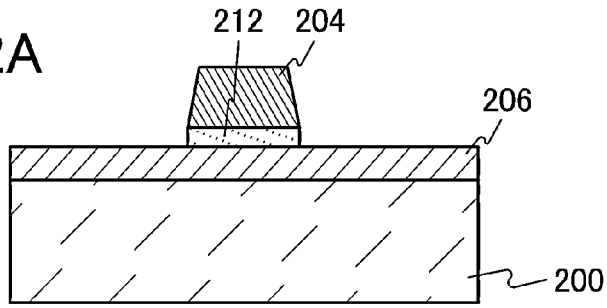
FIGS. 12A to 12D are cross-sectional views illustrating an example of a method for manufacturing a semiconductor device.

A transistor in FIG. 12A includes the oxide semiconductor film 206 over the substrate 200, the gate insulating film 212 over the oxide semiconductor film 206, and the gate electrode 204 provided to overlap with the oxide semiconductor film 206 with the gate insulating film 212 provided therebetween.

Although not illustrated, the oxide semiconductor film 206 includes a channel region, a source region, and a drain region. Further, the oxide semiconductor film 206 may include an LDD region and/or an Loff region.

The transistor in FIG. 12A has a structure in which the sidewall insulating film 208 is not provided; however, the following description is not limited to this structure and can be employed for a structure in which the sidewall insulating film 208 is provided.

Figure 12B:
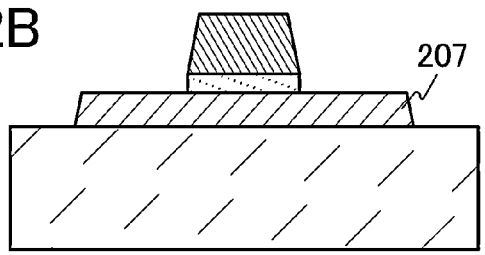

First, the oxide semiconductor film 206 is processed, so that an oxide semiconductor film 207 having an island shape is formed (see FIG. 12B).

Figure 12C:
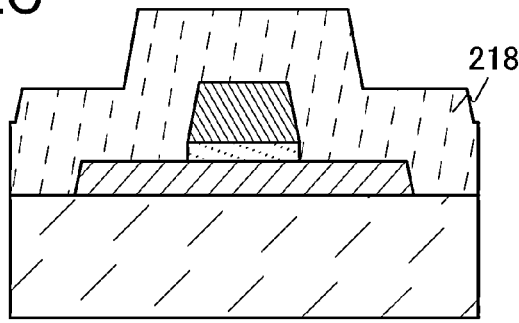

Next, a third insulating film 218 is formed to cover the substrate 200, the oxide semiconductor film 207 having an island shape, the gate electrode 204, and the gate insulating film 212 (see FIG. 12C).

Figure 12D:
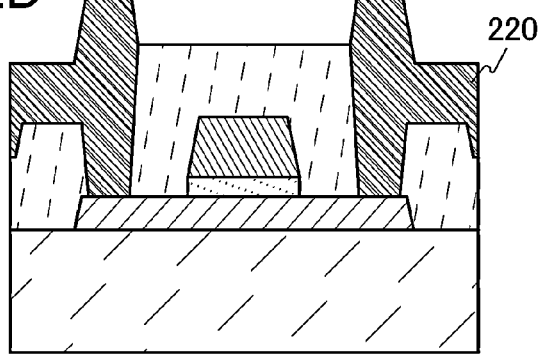

Next, a pair of openings to expose the oxide semiconductor film 207 is formed in the third insulating film 218, and a pair of wirings 220 which is in contact with the oxide semiconductor film 207 through the openings is formed (see FIG. 12D).

As described above, wirings connected to the transistor are formed.

Similarly, another example of a manufacturing method up to and including a step of forming a wiring after the transistor is manufactured will be described.

For a manufacturing method up to and including the step in FIG. 12B, a similar manufacturing method is referred to.

Figure 13A:
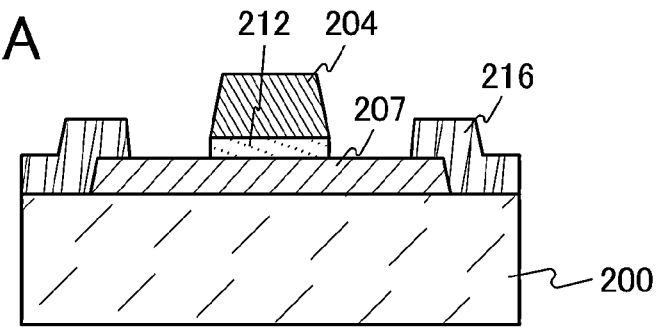
FIGS. 13A to 13C are cross-sectional views illustrating an example of a method for manufacturing a semiconductor device.

First, a pair of electrodes 216 is formed to be in contact with the oxide semiconductor film 207 (see FIG. 13A). Although not illustrated, the pair of electrodes 216 may be provided below and in contact with the oxide semiconductor film 207.

Figure 13B:
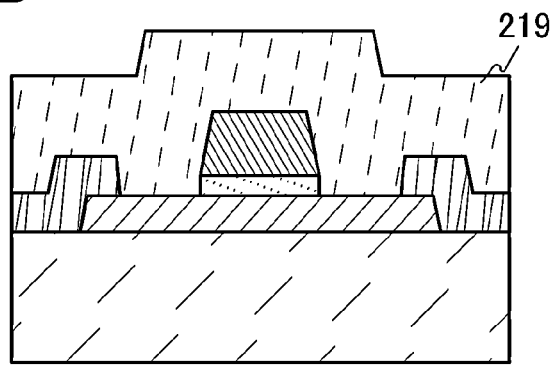

Next, a third insulating film 219 is formed to cover the substrate 200, the pair of electrodes 216, the oxide semiconductor film 207, the gate electrode 204, and the gate insulating film 212 (see FIG. 13B).

Figure 13C:
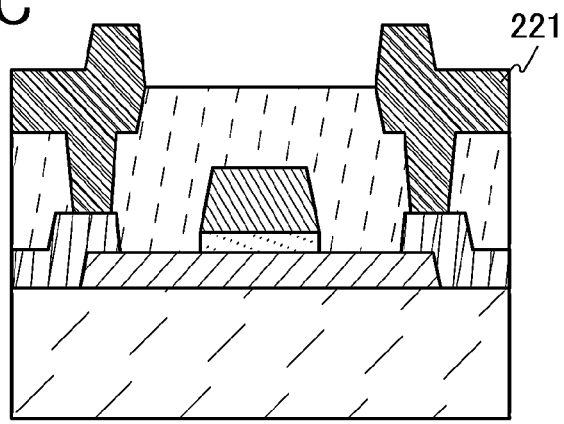

Next, a pair of openings to expose the pair of electrodes 216 is formed in the third insulating film 219, and a pair of wirings 221 which is in contact with the pair of electrodes 216 through the openings is formed (see FIG. 13C).

As described above, wirings connected to the transistor are formed.

In such manner, a transistor including the oxide semiconductor film including a low-resistance region described in Embodiment 1 can be manufactured.

Since the low-resistance region can be provided in a self-aligned manner in the transistor described in this embodiment, parasitic capacitance between the gate electrode and the source and drain regions does not occur and high-speed operation can be realized.

Since the transistor in this embodiment includes the Loff regions and/or the LDD regions, degradation of the transistor, such as hot carrier degradation, can be reduced, and shift of the threshold voltage in the negative direction due to a short channel length can be suppressed. Therefore, also a miniaturized transistor can have favorable electric characteristics.

By application of the transistor described in this embodiment, a high-performance semiconductor device can be manufactured with high yield.

Embodiment 3

In this embodiment, a liquid crystal display device manufactured using the transistor described in Embodiment 2 will be described. Note that an example in which one embodiment of the present invention is applied to a liquid crystal display device will be described in this embodiment; however, the present invention is not limited to this embodiment. For example, application of one embodiment of the present invention to an electroluminescence (EL) display device which is one of light-emitting devices is readily conceived by those skilled in the art.

FIG. 14 is a circuit diagram of an active matrix liquid crystal display device. The liquid crystal display device includes source lines SL_1 to SL_a (a is a natural number), gate lines GL_1 to GL_b (b is a natural number), and a plurality (a×b) of pixels 2200. The pixels 2200 each include a transistor 2230, a capacitor 2220, and a liquid crystal element 2210. The plurality of pixels 2200 with such a structure forms a pixel portion of the liquid crystal display device. Note that a "source line SL" and a "gate line GL" simply refer to a source line and a gate line, respectively, in some cases.

The transistor described in Embodiment 2, which is one embodiment of the present invention, is used as the transistor 2230. Since the transistor described in Embodiment 2 includes an oxide semiconductor having favorable electric characteristics, a liquid crystal display device with high display quality can be obtained.

The gate line GL is connected to a gate of the transistor 2230, the source line SL is connected to a source of the transistor 2230, and a drain of the transistor 2230 is connected to one capacitor electrode of the capacitor 2220 and one pixel electrode of the liquid crystal element 2210. The other capacitor electrode of the capacitor 2220 and the other pixel electrode of the liquid crystal element 2210 are connected to a common electrode. Note that the common electrode may be formed in the same layer as the gate line GL using the same material as the gate line GL.

Further, the gate line GL is connected to a gate driver circuit. The gate driver circuit may include the transistor described in Embodiment 2.

The source line SL is connected to a source driver circuit. The source driver circuit may include the transistor described in Embodiment 2.

Note that either or both of the gate driver circuit and the source driver circuit may be formed over a separately prepared substrate and connected using a method such as chip on glass (COG), wire bonding, or tape automated bonding (TAB).

Since a transistor is easily broken by static electricity or the like, a protection circuit is preferably provided. The protection circuit is preferably formed using a nonlinear element.

On application of a voltage that is higher than or equal to the threshold voltage of the transistor 2230 to the gate line GL, electric charge supplied from the source line SL flows as a drain current of the transistor 2230 and is accumulated in the capacitor 2220. After charging for one row, the transistors 2230 in the row are turned off and voltage application from the source line SL stops; however, a necessary voltage can be kept by the electric charge accumulated in the capacitors 2220. Then, charging of the capacitors 2220 in the next row starts. In this manner, charging for the first row to the b-th row is carried out. A drain current is a current that flows from a drain to a source through a channel in a transistor. The drain current flows when a gate voltage is higher than the threshold voltage.

Note that in the case where a transistor whose off-state current is small is used as the transistor 2230, a time period during which the voltage is held can be longer. By this effect, the display rewriting frequency can be reduced in the case of displaying an image with little motion (including a still image); accordingly, further reduction in the power consumption is possible. Further, the capacitance of the capacitor 2220 can be further reduced; accordingly, power consumed for charging can be reduced.

In the above-described manner, according to one embodiment of the present invention, a liquid crystal display device with high display quality and low power consumption can be provided.

This embodiment can be implemented in appropriate combination with any of the other embodiments.

Embodiment 4

In this embodiment, an example of manufacturing a semiconductor memory device using the transistor described in Embodiment 2 will be described.

As typical examples of a volatile semiconductor memory device, there are a dynamic random access memory (DRAM) which stores data in such a manner that a transistor included in a memory element is selected and electric charge is accumulated in a capacitor, and a static random access memory (SRAM) which retains stored data using a circuit such as a flip-flop.

Typical examples of a nonvolatile semiconductor memory device include a flash memory which has a node between a gate and a channel region of a transistor and stores data by retaining electric charge in the node.

The transistor described in Embodiment 2 can be applied to some of transistors included in the above-described semiconductor memory device.

First, a memory cell included in the semiconductor memory device to which the transistor described in Embodiment 2 is applied will be described with reference to FIGS. 15A and 15B.

Figure 15A:
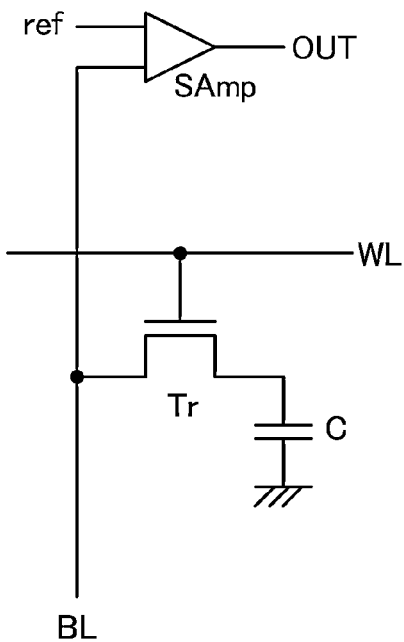
FIG. 15A is a circuit diagram illustrating an example of a semiconductor memory device including a transistor according to one embodiment of the present invention.

The memory cell includes a bit line BL, a word line WL, a sense amplifier SAmp, a transistor Tr, and a capacitor C (see FIG. 15A).

Figure 15B:
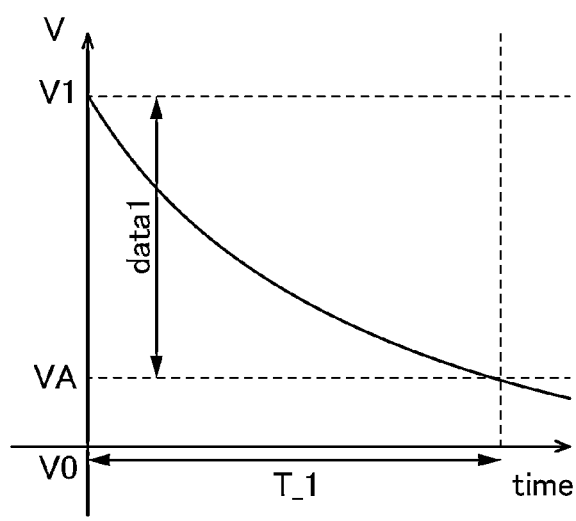
FIG. 15B shows electric characteristics thereof.

It is known that the voltage retained in the capacitor C is gradually reduced over time due to the off-state current of the transistor Tr as shown in FIG. 15B. After a certain period of time, the voltage originally charged from V0 to V1 is decreased to VA which is a limit for reading data 1. This period is called a retention period T_1. In the case of a two-level memory cell, refresh needs to be performed within the retention period T_1.

Here, when the transistor described in Embodiment 2 is used as the transistor Tr, the retention period T_1 can be increased because the off-state current of the transistor is small. That is, the frequency of the refresh operation can be reduced, which results in reduction in power consumption. For example, in the case where a memory cell is formed with use of a transistor including an oxide semiconductor film with an off-state current of $1\times10^{-21}$ A or less, preferably $1\times10^{-24}$ A or less, data can be retained for several days to several tens of years without supply of electric power.

As described above, according to one embodiment of the present invention, a memory cell included in a highly reliable semiconductor memory device with low power consumption can be obtained.

Next, an example of a memory cell included in a semiconductor memory device to which the transistor described in Embodiment 2 is applied, which is different from the memory cell in FIGS. 15A and 15B, will be described with reference to FIGS. 16A and 16B.

Figure 16A:
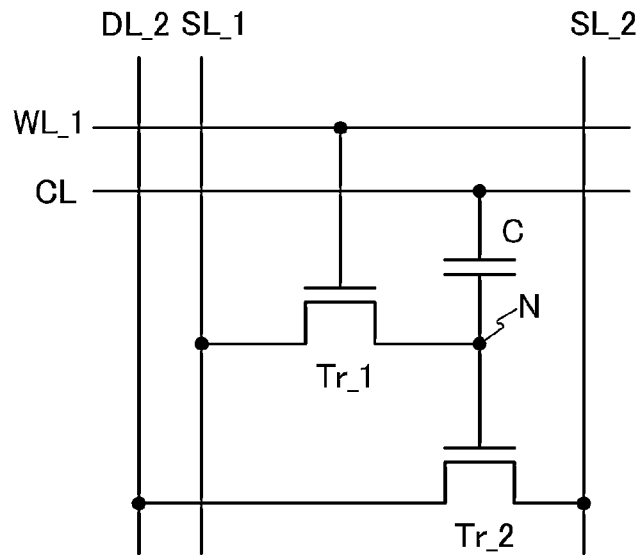
FIG. 16A is a circuit diagram illustrating an example of a semiconductor memory device including a transistor according to one embodiment of the present invention.
Figure 16B:
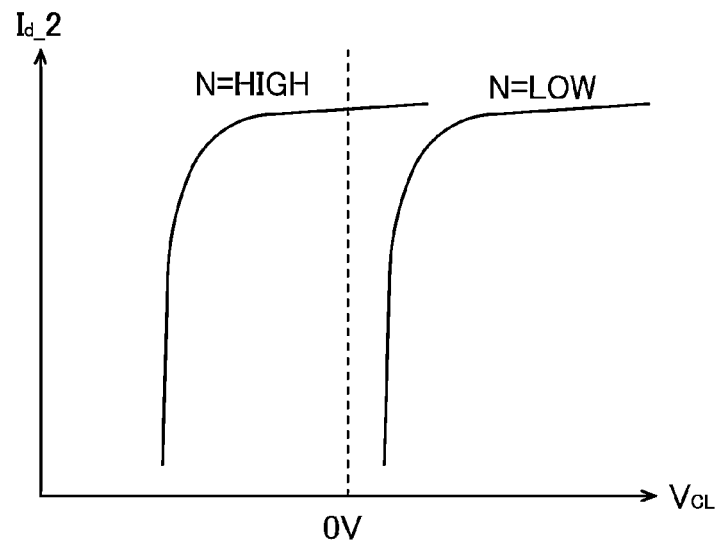
FIG. 16B shows electric characteristics thereof.

FIG. 16A is a circuit diagram of a memory cell included in the semiconductor memory device. The memory cell includes a transistor Tr_1, a word line WL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one terminal of the capacitor C, and a node N connected to the other terminal of the capacitor C, a drain of the transistor Tr_1, and a gate of the transistor Tr_2.

The memory cell described in this embodiment utilizes variation in an apparent threshold voltage of the transistor Tr_2, which depends on the potential of the node N. For example, FIG. 16B shows a relation between a voltage $V_{CL}$ of the capacitor line CL and a drain current $I_{d\_2}$ flowing through the transistor Tr_2.

Here, the voltage of the node N can be adjusted through the transistor Tr_1. For example, the potential of the source line SL_1 is set to VDD. In this case, when the potential of the word line WL_1 is set to higher than or equal to a potential obtained by adding VDD to the threshold voltage Vth of the transistor Tr_1, the voltage of the node N can be HIGH. Further, when the potential of the word line WL_1 is set to lower than or equal to the threshold voltage Vth of the transistor Tr_1, the potential of the node N can be LOW.

Thus, either a $V_{CL}$-$I_{d\_2}$ curve (N=LOW) or a $V_{CL}$-$I_{d\_2}$ curve (N=HIGH) can be obtained. That is, when N=LOW, $I_{d\_2}$ is small at a $V_{CL}$ of 0 V; accordingly, data 0 is stored. Further, when N=HIGH, $I_{d\_2}$ is large at a $V_{CL}$ of 0 V; accordingly, data 1 is stored. In this manner, data can be stored.

Here, when the transistor described in Embodiment 2 is used as the transistor Tr_1, the off-state current of the transistor can be significantly reduced; therefore, unintentional leakage of an electric charge accumulated in the node N by flowing between the source and the drain of the transistor Tr_1 can be suppressed. Therefore, data can be retained for a long period. With use of one embodiment of the present invention, the threshold voltage of the transistor Tr_1 is adjusted, which enables reduction in the voltage necessary for writing. Thus, power consumption can be made small as compared to a flash memory or the like.

Note that the transistor described in Embodiment 2 may also be applied to the transistor Tr_2.

In the above-described manner, according to one embodiment of the present invention, a semiconductor memory device with high reliability for a long period, low power consumption, and a high degree of integration can be obtained.

This embodiment can be implemented in appropriate combination with any of the other embodiments.

Embodiment 5

A central processing unit (CPU) can be formed with the use of the transistor described in Embodiment 2 or the semiconductor memory device described in Embodiment 4 for at least part of the CPU.

Figure 17A:
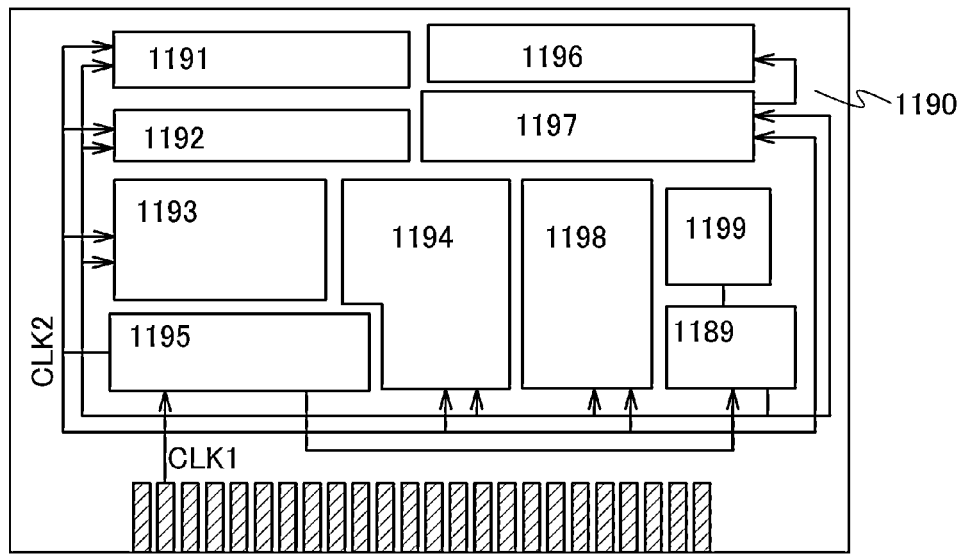
FIG. 17A is a block diagram illustrating a specific example of a CPU including a transistor according to one embodiment of the present invention.

FIG. 17A is a block diagram illustrating a specific structure of the CPU. The CPU illustrated in FIG. 17A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 17A is just an example in which the configuration has been simplified, and an actual CPU may have a variety of configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 17A, a memory element is provided in the register 1196. As the memory element in the register 1196, for example, the semiconductor memory device described in Embodiment 4 can be used.

In the CPU illustrated in FIG. 17A, the register controller 1197 selects operation of retaining data in the register 1196 in accordance with an instruction from the ALU 1191. That is, the register controller 1197 selects whether data is retained by a flip flop or a capacitor in the memory element included in the register 1196. When data is retained by the flip flop, a power supply voltage is supplied to the memory element in the register 1196. When data is retained by the capacitor, the data in the capacitor is rewritten, and supply of the power supply voltage to the memory element in the register 1196 can be stopped.

Figure 17B:
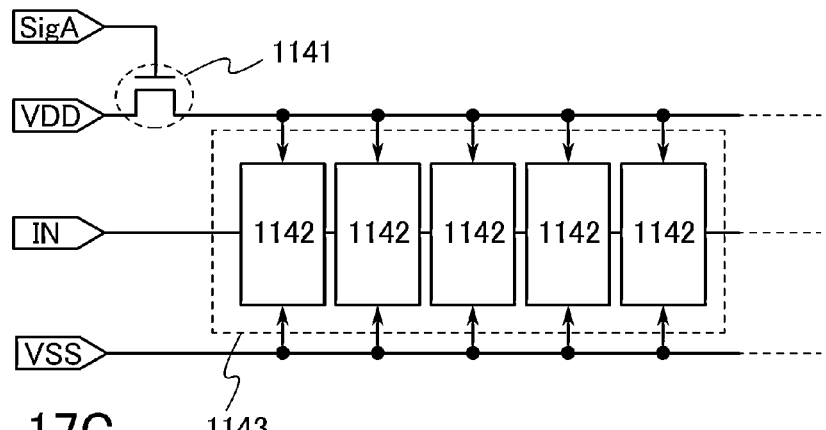
FIGS. 17B and 17C are circuit diagrams each illustrating part of the CPU.
Figure 17C:
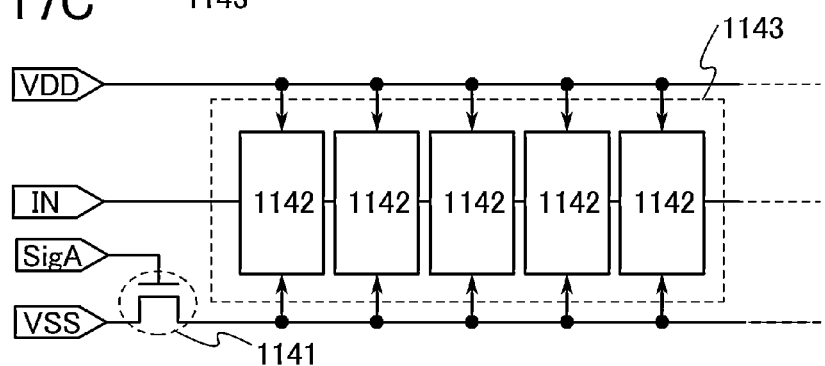

The power supply can be stopped by providing a switching element between a memory element group and a node to which a power supply potential VDD or a power supply potential VSS is supplied, as illustrated in FIG. 17B or FIG. 17C. Circuits illustrated in FIGS. 17B and 17C will be described below.

FIGS. 17B and 17C each illustrate an example of a structure including the transistor described in Embodiment 2 as a switching element for controlling supply of a power supply potential to a memory element.

The memory device illustrated in FIG. 17B includes a switching element 1141 and a memory element group 1143 including a plurality of memory elements 1142. Specifically, as each of the memory elements 1142, the memory element described in Embodiment 4 can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and a potential of the low-level power supply potential VSS.

In FIG. 17B, as the switching element 1141, the transistor with extremely small off-state current which is described in Embodiment 2 is used, and the switching of the transistor is controlled by a signal SigA supplied to a gate thereof.

Note that FIG. 17B illustrates the structure in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

In FIG. 17C, an example of a memory device in which each of the memory elements 1142 included in the memory element group 1143 is supplied with the low-level power supply potential VSS through the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be retained even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented in appropriate combination with any of the other embodiments Embodiment 6

A semiconductor device having an image sensor function of reading data of an object can be manufactured using the transistor described in Embodiment 2.

Figure 18A:
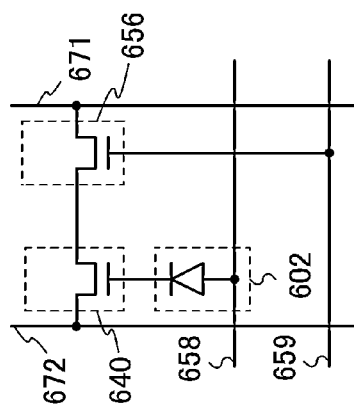
FIG. 18A is a circuit diagram illustrating an example of an image sensor including a transistor according to one embodiment of the present invention.

FIG. 18A illustrates an example of a semiconductor device having an image sensor function. FIG. 18A is an equivalent circuit diagram of a photosensor, and FIG. 18B is a cross-sectional view illustrating part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photosensor output signal line 671.

Note that in FIG. 18A, the transistor described in Embodiment 2 can be used as each of the transistors 640 and 656.

Figure 18B:
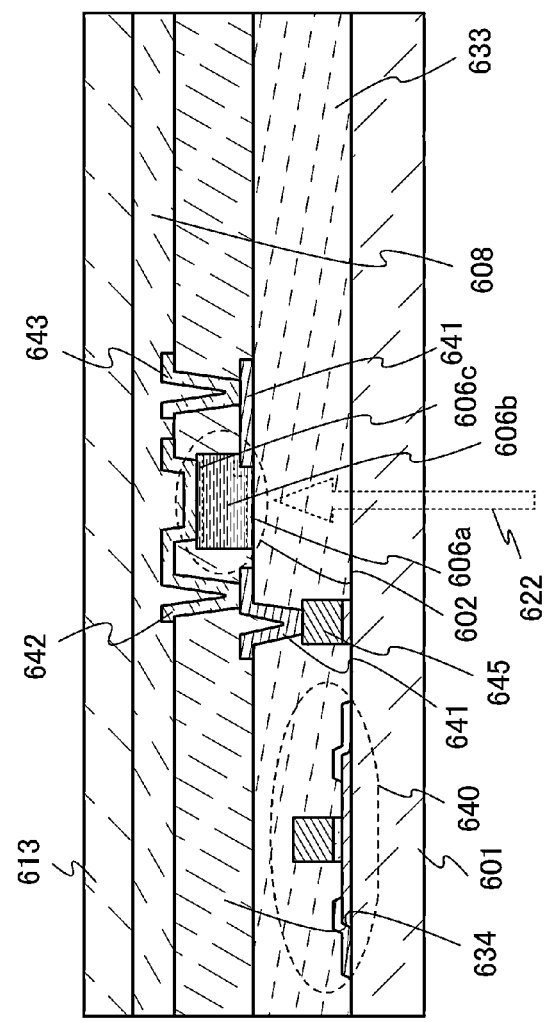
FIG. 18B is a cross-sectional view thereof.

FIG. 18B is a cross-sectional view of the photodiode 602 and the transistor 640 in the photosensor. The photodiode 602 functioning as a sensor and the transistor 640 are provided over a substrate 601 having an insulating surface. A substrate 613 is provided over the photodiode 602 and the transistor 640 with the use of an adhesive layer 608.

An interlayer insulating film 633 and an interlayer insulating film 634 are provided over the transistor 640. The photodiode 602 is provided over the interlayer insulating film 633. In the photodiode 602, a first semiconductor film 606*a*, a second semiconductor film 606*b*, and a third semiconductor film 606*c* are sequentially stacked from the interlayer insulating film 633 side, between an electrode 641 formed over the interlayer insulating film 633 and an electrode 642 formed over the interlayer insulating film 634.

The electrode 641 is electrically connected to a conductive layer 643 formed over the interlayer insulating film 634, and the electrode 642 is electrically connected to a conductive film 645 through the electrode 641. The conductive film 645 is electrically connected to a gate electrode of the transistor 640, and thus the photodiode 602 is electrically connected to the transistor 640.

Here, a pin photodiode in which a semiconductor film having p-type conductivity as the first semiconductor film 606*a*, a high-resistance semiconductor film (i-type semiconductor film) as the second semiconductor film 606*b*, and a semiconductor film having n-type conductivity as the third semiconductor film 606*c* are stacked is illustrated as an example.

The first semiconductor film 606*a* is a p-type semiconductor film and can be formed using an amorphous silicon film containing an impurity element imparting p-type conductivity. The first semiconductor film 606*a* is formed by a plasma CVD method with the use of a semiconductor source gas containing an impurity element belonging to Group 13 (e.g., boron). As the semiconductor source gas, monosilane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method for forming the amorphous silicon film, a thermal CVD method, a plasma CVD method, a sputtering method, or the like may be used. The first semiconductor film 606*a* is preferably formed to have a thickness greater than or equal to 10 nm and less than or equal to 50 nm.

The second semiconductor film 606*b* is an i-type semiconductor film and is formed using an amorphous silicon film. As the second semiconductor film 606*b*, an amorphous silicon film is formed by a plasma CVD method with the use of a semiconductor source gas. As the semiconductor source gas, monosilane ($SiH_4$) may be used. Alternatively, $Si_2H_6$, $SiH_2Cl_2$, $SiHCl_3$, $SiCl_4$, $SiF_4$, or the like may be used. The second semiconductor film 606*b* may be formed by a thermal CVD method, a plasma CVD method, a sputtering method, or the like. The second semiconductor film 606*b* is preferably formed to have a thickness greater than or equal to 200 nm and less than or equal to 1000 nm.

The third semiconductor film 606c is an n-type semiconductor film and can be formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus). As the semiconductor source gas, monosilane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method for forming the amorphous silicon film, a thermal CVD method, a plasma CVD method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor.

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Light from the semiconductor film having a conductivity type opposite to that of the semiconductor film on the light-receiving plane is disturbance light; therefore, the electrode is preferably formed using a light-blocking conductive film. Note that the n-type semiconductor film side may alternatively be a light-receiving plane.

With the use of an insulating material, the interlayer insulating film 633 and the interlayer insulating film 634 can be formed, depending on the material, by a method such as a sputtering method, a plasma CVD method, an SOG method, spin coating, dipping, spray coating, a droplet discharge method (such as an inkjet method), a printing method (such as screen printing or offset printing) or with a tool such as a doctor knife, a roll coater, a curtain coater, or a knife coater.

For reduction of surface roughness, an insulating film functioning as a planarizing insulating film is preferably used as each of the interlayer insulating films 633 and 634. For the interlayer insulating films 633 and 634, for example, an organic insulating material having heat resistance, such as a polyimide, an acrylic resin, a benzocyclobutene resin, a polyamide, or an epoxy resin, can be used. Other than such organic insulating materials, it is possible to use a single layer or stacked layers of any of low-dielectric constant materials (low-k material) such as a siloxane-based resin, phosphosilicate glass (PSG), and borophosphosilicate glass (BPSG).

With detection of light that enters the photodiode 602, data on an object to be detected can be read. Note that a light source such as a backlight can be used at the time of reading data on an object to be detected.

Accordingly, on-state characteristics (e.g., on-state current and field-effect mobility) of the transistor including an oxide semiconductor film including low-resistance regions between which a channel formation region is provided in the channel length direction are increased, which enables high-speed operation and high-speed response of the transistor. Further, the transistor can be miniaturized. Thus, by using the transistor, a high-performance, highly reliable semiconductor device can be provided.

This embodiment can be implemented in appropriate combination with any of the structures described in the other embodiments.

Embodiment 7

In this embodiment, examples of electronic devices to which any of Embodiments 2 to 5 is applied will be described.

Figure 19A:
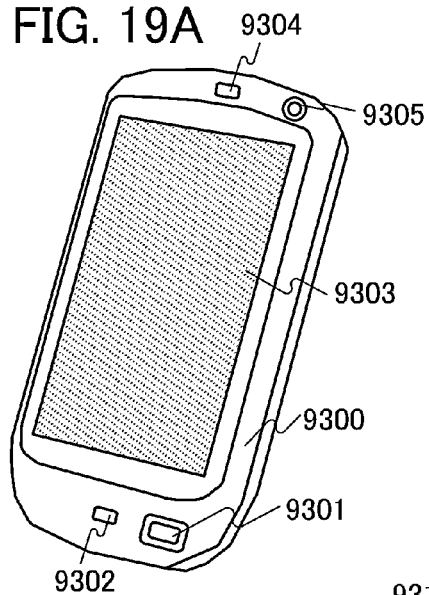
FIGS. 19A to 19C are perspective views each illustrating an example of an electronic device according to one embodiment of the present invention.

FIG. 19A illustrates a portable information terminal. The portable information terminal illustrated in FIG. 19A includes a housing 9300, a button 9301, a microphone 9302, a display portion 9303, a speaker 9304, and a camera 9305, and has a function as a mobile phone. One embodiment of the present invention can be applied to the display portion 9303 and the camera 9305. Although not illustrated, one embodiment of the present invention can also be applied to an arithmetic unit, a wireless circuit, or a memory circuit inside the main body.

Figure 19B:
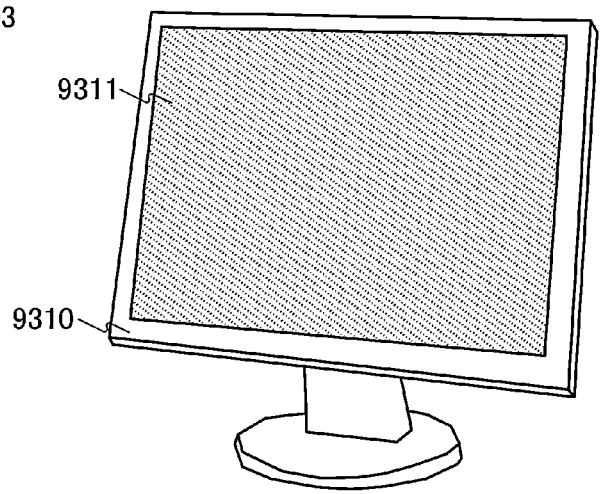

FIG. 19B illustrates a display. The display illustrated in FIG. 19B includes a housing 9310 and a display portion 9311. One embodiment of the present invention can be applied to the display portion 9311. When one embodiment of the present invention is applied, a display having high display quality can be provided even in the case where the size of the display portion 9311 is increased.

Figure 19C:
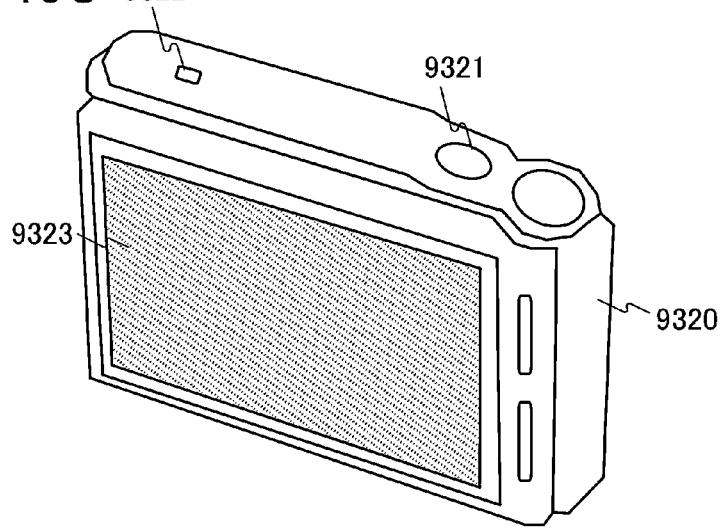

FIG. 19C illustrates a digital still camera. The digital still camera illustrated in FIG. 19C includes a housing 9320, a button 9321, a microphone 9322, and a display portion 9323. One embodiment of the present invention can be applied to the display portion 9323. Although not illustrated, the digital still camera may include a memory element or an image sensor according to one embodiment of the present invention.

When one embodiment of the present invention is applied, the performance of an electronic device can be improved and the reliability of the electronic device can be improved.

This embodiment can be implemented in appropriate combination with any of the other embodiments.

Example 1

In this example, a low-resistance oxide semiconductor film will be described.

A method for manufacturing samples will be described below.

First, a glass substrate was prepared.

Next, a 330-nm-thick silicon oxide film was deposited over the glass substrate.

The silicon oxide film was deposited using a quartz target by a sputtering method. The other conditions were as follows: the deposition power was 5 kW (RF), the deposition pressure was 0.4 Pa, the deposition gas was argon at a flow rate of 25 sccm and oxygen at a flow rate of 25 sccm, and the substrate temperature at deposition was 100° C.

After that, CMP treatment was performed, and the silicon oxide film was planarized to have a thickness of 300 nm.

Next, an In—Sn—Zn—O film as an oxide semiconductor film was deposited to have a thickness of 30 nm.

The oxide semiconductor film was deposited using an In—Sn—Zn—O target (In:Sn:Zn=2:1:3 (in atomic ratio)) by a sputtering method. The other conditions were as follows: the deposition power was 0.5 kW (DC), the deposition pressure was 0.4 Pa, the deposition gas was oxygen at a flow rate of 50 sccm, and the substrate temperature at deposition was 300° C.

A sample manufactured in the above manner was used as Sample 1.

Further, in Sample 1, an aluminum film was deposited over the oxide semiconductor film to have a thickness of 20 nm as a film having a reducing property.

The aluminum film was deposited using an aluminum target by a sputtering method. The other conditions were as follows: the deposition power was 1 kW (DC), the deposition pressure was 0.4 Pa, the deposition gas was argon at a flow rate of 50 sccm, and the substrate temperature at deposition was room temperature.

Next, heat treatment was performed. The heat treatment was performed in a nitrogen atmosphere for one hour. The temperature of the heat treatment was 200° C., 300° C., or 450° C.

Next, the aluminum film was removed. The aluminum film was removed using an Al-Etchant (an aqueous solution containing nitric acid of 2.0 wt %, acetic acid of 9.8 wt %, and phosphoric acid of 72.3 wt %) produced by Wako Pure Chemical Industries, Ltd. for 60 seconds, and it was confirmed that the aluminum film was completely removed.

Here, a sample which was subjected to heat treatment at 200° C. was referred to as Sample 2, a sample which was subjected to heat treatment at 300° C. was referred to as Sample 3, a sample which was subjected to heat treatment at 450° C. was referred to as Sample 4, and a sample which was not subjected to heat treatment was referred to as Sample 5.

Next, the sheet resistance values of Samples 1 to 5 were measured. The results are shown in FIG. 20.

Figure 20:
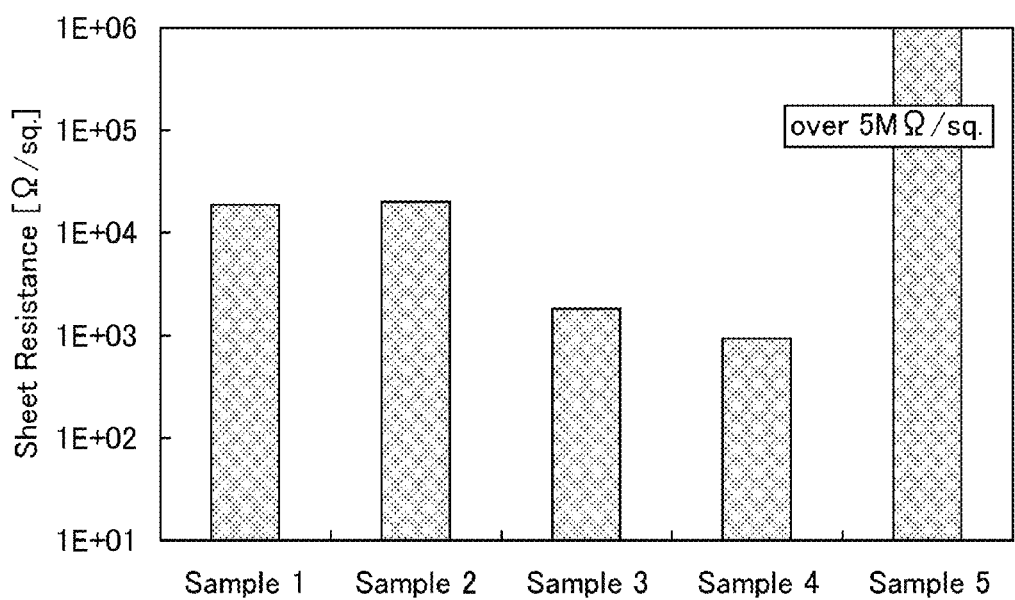
FIG. 20 is a graph showing sheet resistance values of low-resistance oxide semiconductor films.

It is found from FIG. 20 that Sample 5 has a sheet resistance of greater than or equal to measurement limit (5 MΩ/sq.) of a sheet resistance measurer. In addition, it is found that each of the sheet resistances of Samples 1 to 4 is lower than that of Sample 5.

In particular, Samples 3 and 4 have lower resistances. Thus, it is found that the resistance of the oxide semiconductor film is able to be further reduced in such a manner that an aluminum film is formed over the oxide semiconductor film and heat treatment is performed at higher than or equal to 300° C.

Example 2

In this example, an example where the resistance of an oxide semiconductor film is reduced by a method different from the method in Example 1 will be described.

A method for manufacturing samples will be described below.

First, a glass substrate was prepared.

Next, a 330-nm-thick silicon oxide film was deposited over the glass substrate.

The silicon oxide film was deposited using a quartz target by a sputtering method. The other conditions were as follows: the deposition power was 5 kW (RF), the deposition pressure was 0.4 Pa, the deposition gas was argon at a flow rate of 25 sccm and oxygen at a flow rate of 25 sccm, and the substrate temperature at deposition was 100° C.

After that, CMP treatment was performed, and the silicon oxide film was planarized to have a thickness of 300 nm.

Next, an In—Sn—Zn—O film as an oxide semiconductor film was deposited to have a thickness of 30 nm.

The oxide semiconductor film was deposited using an In—Sn—Zn—O target (In:Sn:Zn=2:1:3 (in atomic ratio)) by a sputtering method. The other conditions were as follows: the deposition power was 0.5 kW (DC), the deposition pressure was 0.4 Pa, the deposition gas was oxygen at a flow rate of 50 sccm, and the substrate temperature at deposition was 300° C.

Next, an aluminum film was deposited over the oxide semiconductor film to have a thickness of 20 nm as a film having a reducing property.

The aluminum film was deposited using an aluminum target by a sputtering method. The other conditions were as follows: the deposition power was 1 kW (DC), the deposition pressure was 0.4 Pa, the deposition gas was argon at a flow rate of 50 sccm, and the substrate temperature at deposition was room temperature.

Next, an impurity was added to the oxide semiconductor film through the aluminum film.

The impurity was added by an ion implantation method.

A sample to which a phosphorus ion was added as the impurity at a concentration of $5\times10^{14}$ ions/cm$^2$ was referred to as Sample 6. A sample to which a phosphorus ion was added as the impurity at a concentration of $1\times10^{15}$ ions/cm$^2$ was referred to as Sample 7. A sample to which a phosphorus ion was added as the impurity at a concentration of $3\times10^{15}$ ions/cm$^2$ was referred to as Sample 8. Note that the acceleration voltage was 40 kV.

Similarly, a sample to which a boron ion was added as the impurity at a concentration of $5\times10^{14}$ ions/cm$^2$ was referred to as Sample 9. A sample to which a boron ion was added as the impurity at a concentration of $1\times10^{15}$ ions/cm$^2$ was referred to as Sample 10. A sample to which a boron ion was added as the impurity at a concentration of $3\times10^{15}$ ions/cm$^2$ was referred to as Sample 11. Note that the acceleration voltage was 15 kV.

Next, heat treatment was performed. The heat treatment was performed in a nitrogen atmosphere for one hour. The temperature of the heat treatment was 200° C. or 300° C.

Next, the aluminum film was removed. The aluminum film was removed using an Al-Etchant (an aqueous solution containing nitric acid of 2.0 wt %, acetic acid of 9.8 wt %, and phosphoric acid of 72.3 wt %) produced by Wako Pure Chemical Industries, Ltd. for 60 seconds, and it was confirmed that the aluminum film was completely removed.

Next, the sheet resistance values of Samples 6 to 11 were measured. The results are shown in FIG. 21.

Here, the sheet resistance value of a sample which was subjected to heat treatment at 200° C. was represented by a white bar, and the sheet resistance value of a sample which was subjected to heat treatment was performed at 300° C. was represented by a shaded bar.

Figure 21:
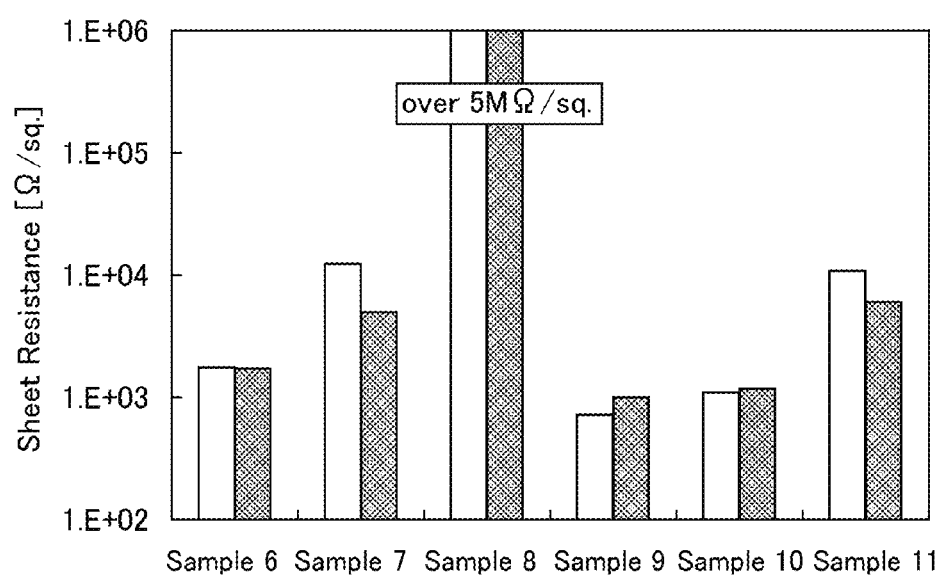
FIG. 21 is a graph showing sheet resistance values of low-resistance oxide semiconductor films.

It is found from FIG. 21 that each of the resistances of Samples 6, 9, and 10 is reduced to approximately 1 kΩ/sq.

Further, it is found that each of the resistances of the other samples except Sample 8 is reduced to approximately 10 kΩ/sq. or less.

In particular, the oxide semiconductor film obtained in such a manner that heat treatment was performed on Sample 9 at 200° C. has a low resistance. Thus, it is found that the resistance of the oxide semiconductor film is able to be further reduced in such a manner that an aluminum film is deposited over the oxide semiconductor film, a boron ion is added at a concentration of about $5\times10^{14}$ ions/cm$^2$, and heat treatment is performed at 200° C.

This application is based on Japanese Patent Application serial no. 2011-161252 filed with Japan Patent Office on Jul. 22, 2011, the entire contents of which are hereby incorporated by reference.

What is claimed is:

1. A semiconductor device comprising:
an oxide semiconductor layer over an insulating surface, the oxide semiconductor layer comprising:
a source region including a first region;
a drain region including a second region; and
a channel region including a third region;
a first insulating layer over the oxide semiconductor layer;
a gate electrode over the insulating layer; and
a second insulating layer over the gate electrode,
wherein the source region and the drain region contains an impurity,
wherein the source region and the drain region are formed in a self-aligned manner with respect to the gate electrode,
wherein the first region and the second region includes a metal element,
wherein the metal element is not a main component of the second insulating layer,
wherein a concentration of oxygen in the first region is lower than a concentration of oxygen in the third region, and
wherein a concentration of oxygen in the second region is lower than the concentration of oxygen in the third region.

2. The semiconductor device according to claim 1, wherein the impurity is at least one selected from the group consisting of hydrogen, helium, boron, nitrogen, fluoride, neon, aluminum, phosphorus, argon, arsenic, krypton, indium, tin, antimony, xenon and a combination thereof.

3. The semiconductor device according to claim 1, wherein the metal element is at least one selected from the group consisting of magnesium, aluminum, silicon, titanium, vanadium, chromium, nickel, yttrium, zirconium, niobium, molybdenum, cerium, neodymium, hafnium, tantalum, tungsten and a combination thereof.

4. The semiconductor device according to claim 1,
wherein the oxide semiconductor layer includes crystals, and
wherein c-axes of the crystals are aligned in a direction substantially parallel to a normal vector of a surface of the oxide semiconductor layer.

5. The semiconductor device-according to claim 1, further comprising:
a first electrode over and in electrical contact with the source region; and
a second electrode over and in electrical contact with the drain region.

6. A semiconductor device comprising:
an oxide semiconductor layer over an insulating surface, the oxide semiconductor layer comprising:
a source region including a first region;
a drain region including a second region; and
a channel region including a third region;
a first insulating layer over the oxide semiconductor layer;
a gate electrode over the insulating layer; and
a second insulating layer over the gate electrode,
wherein the source region and the drain region contains an impurity,
wherein the source region and the drain region are formed in a self-aligned manner with respect to the gate electrode,
wherein the first region and the second region includes a material having a reducing property,
wherein the material is not a main component of the second insulating layer,
wherein a concentration of oxygen in the first region is lower than a concentration of oxygen in the third region, and
wherein a concentration of oxygen in the second region is lower than the concentration of oxygen in the third region.

7. The semiconductor device according to claim 6, wherein the impurity is at least one selected from the group consisting of hydrogen, helium, boron, nitrogen, fluoride, neon, aluminum, phosphorus, argon, arsenic, krypton, indium, tin, antimony, xenon and a combination thereof.

8. The semiconductor device according to claim 6, wherein the material is at least one selected from the group consisting of magnesium, aluminum, silicon, titanium, vanadium, chromium, nickel, yttrium, zirconium, niobium, molybdenum, cerium, neodymium, hafnium, tantalum, tungsten and a combination thereof.

9. The semiconductor device according to claim 6,
wherein the oxide semiconductor layer includes crystals, and
wherein c-axes of the crystals are aligned in a direction substantially parallel to a normal vector of a surface of the oxide semiconductor layer.

10. The semiconductor device according to claim 6, further comprising:
a first electrode over and in electrical contact with the source region; and
a second electrode over and in electrical contact with the drain region.

11. A semiconductor device comprising:
an oxide semiconductor layer over an insulating surface, the oxide semiconductor layer comprising:
a source region including a first region;
a drain region including a second region; and
a channel region including a third region;
a first insulating layer over the oxide semiconductor layer;
a gate electrode over the insulating layer;
a sidewall insulating layer over the insulating layer; and
a second insulating layer over the gate electrode;
wherein the source region and the drain region contains an impurity,
wherein the source region is formed in a self-aligned manner with respect to the gate electrode and the sidewall insulating layer,
wherein the first region and the second region includes a metal element,
wherein the metal element is not a main component of the second insulating layer,
wherein a concentration of oxygen in the first region is lower than a concentration of oxygen in the third region, and
wherein a concentration of oxygen in the second region is lower than the concentration of oxygen in the third region.

12. The semiconductor device according to claim 11, wherein the impurity is at least one selected from the group consisting of hydrogen, helium, boron, nitrogen, fluoride, neon, aluminum, phosphorus, argon, arsenic, krypton, indium, tin, antimony, xenon and a combination thereof.

13. The semiconductor device according to claim 11, wherein the metal element is at least one selected from the group consisting of magnesium, aluminum, silicon, titanium, vanadium, chromium, nickel, yttrium, zirconium, niobium, molybdenum, cerium, neodymium, hafnium, tantalum, tungsten and a combination thereof.

14. The semiconductor device according to claim 11,
wherein the oxide semiconductor layer includes crystals, and
wherein c-axes of the crystals are aligned in a direction substantially parallel to a normal vector of a surface of the oxide semiconductor layer.

15. The semiconductor device according to claim 11, further comprising:
a first electrode over and in electrical contact with the source region; and
a second electrode over and in electrical contact with the drain region.

* * * * *